US011422637B2

(12) United States Patent
Clark et al.

(10) Patent No.: US 11,422,637 B2
(45) Date of Patent: Aug. 23, 2022

(54) COMPUTER INPUT DEVICES

(71) Applicant: Sonuus Limited, St Neots (GB)

(72) Inventors: James Hastings Clark, St Neots (GB); John Michael McAuliffe, St Neots (GB); Archibald J. Clark, St Neots (GB)

(73) Assignee: SONUUS LIMITED, St Neots (GB)

( * ) Notice: Subject to any disclaimer, the term of this patent is extended or adjusted under 35 U.S.C. 154(b) by 0 days.

(21) Appl. No.: 17/266,446

(22) PCT Filed: Aug. 7, 2019

(86) PCT No.: PCT/GB2019/052220
§ 371 (c)(1),
(2) Date: Feb. 5, 2021

(87) PCT Pub. No.: WO2020/030911
PCT Pub. Date: Feb. 13, 2020

(65) Prior Publication Data
US 2021/0294431 A1    Sep. 23, 2021

(30) Foreign Application Priority Data

Aug. 7, 2018  (GB) ...................................... 1812826
Jun. 26, 2019 (GB) ...................................... 1909214

(51) Int. Cl.
*G06F 3/02*   (2006.01)
*G06F 3/023*  (2006.01)
(Continued)

(52) U.S. Cl.
CPC ............ *G06F 3/0205* (2013.01); *G06F 3/023* (2013.01); *G10D 13/02* (2013.01); *G10D 13/20* (2020.02);
(Continued)

(58) Field of Classification Search
None
See application file for complete search history.

(56) References Cited

U.S. PATENT DOCUMENTS

| 4,425,511 A | 1/1984 | Brosh |
|---|---|---|
| 4,580,478 A | 4/1986 | Brosh |

(Continued)

FOREIGN PATENT DOCUMENTS

| CN | 205942706 U | 2/2017 |
|---|---|---|
| EP | 3096457 A1 | 11/2016 |

(Continued)

OTHER PUBLICATIONS

Search Report issued in GB Appln. No. 1909214.7 dated Dec. 23, 2019.

(Continued)

*Primary Examiner* — Matthew Yeung
(74) *Attorney, Agent, or Firm* — Rossi, Kimms & McDowell LLP

(57) ABSTRACT

A sensing system for a computer input device. The sensing system comprises an actuator to attach to a key top or button. The actuator is moveable along an axis or hinged. The sensing system further comprises a biasing element to exert a biasing force on the actuator directed along the axis. The sensing system further comprises an actuator motion sensor associated with the actuator. The actuator motion sensor comprises a passive resonant circuit configured to be moved by the actuator and having a resonant frequency, an active resonant circuit configured to excite the passive resonant circuit at the resonant frequency, a sensor driver to drive the active resonant circuit with an RF drive signal at the resonant frequency, and a detector to detect a level of RF signal from a driven actuator motion sensor for sensing a position and/or velocity of the actuator.

21 Claims, 15 Drawing Sheets

(51) Int. Cl.
*H03K 17/95* (2006.01)
*G10D 13/20* (2020.01)
*G10D 13/10* (2020.01)
*G10D 13/02* (2020.01)
*G10H 1/32* (2006.01)
*G10H 3/14* (2006.01)

(52) U.S. Cl.
CPC ............ *G10D 13/26* (2020.02); *G10H 1/32* (2013.01); *G10H 3/146* (2013.01); *H03K 17/954* (2013.01); *G10H 2220/425* (2013.01); *G10H 2220/461* (2013.01); *G10H 2230/275* (2013.01)

(56) References Cited

U.S. PATENT DOCUMENTS

| | | | |
|---|---|---|---|
| 4,838,139 | A | 6/1989 | Fiori, Jr. |
| 4,852,443 | A | 8/1989 | Duncan |
| 4,980,519 | A | 12/1990 | Mathews |
| 5,129,654 | A | 7/1992 | Bogner |
| 6,150,600 | A | 11/2000 | Buchla |
| 7,952,519 | B1 | 5/2011 | Nielsen |
| 8,207,729 | B2 | 6/2012 | Erickson |
| 8,690,670 | B2 | 4/2014 | Kay |
| 8,922,399 | B2 | 12/2014 | Bajaj |
| 8,933,314 | B2 | 1/2015 | Clark |
| 2002/0140419 | A1 | 10/2002 | Duret |
| 2004/0056781 | A1 | 3/2004 | Rix |
| 2004/0069856 | A1* | 4/2004 | Held ................ G06K 19/07749 235/492 |
| 2006/0114129 | A1 | 6/2006 | Henty |
| 2007/0181410 | A1* | 8/2007 | Baier ..................... G05G 1/025 200/17 R |
| 2009/0128337 | A1* | 5/2009 | Oberle .................. G06F 3/0202 340/572.5 |
| 2009/0282962 | A1 | 11/2009 | Jones |
| 2011/0102259 | A1 | 5/2011 | Ledvina |
| 2011/0187204 | A1 | 8/2011 | Lacey et al. |
| 2013/0002477 | A1 | 1/2013 | Dehnie |
| 2013/0093436 | A1 | 4/2013 | Thorn |
| 2014/0274395 | A1 | 9/2014 | Ellsworth |
| 2015/0170625 | A1 | 6/2015 | Clark |
| 2017/0031050 | A1 | 2/2017 | Lisi |
| 2019/0094984 | A1* | 3/2019 | Lin ........................ G06F 3/0219 |
| 2020/0320966 | A1 | 10/2020 | Clark |

FOREIGN PATENT DOCUMENTS

| | | |
|---|---|---|
| EP | 3208796 A1 | 8/2017 |
| EP | 3291223 A1 | 3/2018 |
| GB | 2320125 A | 6/1998 |
| GB | 2482651 A | 2/2012 |
| GB | 2494230 A | 3/2013 |
| GB | 2530117 A | 3/2016 |
| WO | 2004025402 A2 | 3/2004 |
| WO | 2011128698 A1 | 10/2011 |
| WO | 2019122867 A1 | 6/2019 |

OTHER PUBLICATIONS

International Search Report issued in Intl. Appln. No. PCT/GB2019/052220 dated Nov. 5, 2019.
Written Opinion issued in Intl. Appln. No. PCT/GB2019/052220 dated Nov. 5, 2019.
International Search Report issued in Intl. Appln. No. PCT/GB2019/052221 dated Oct. 29, 2019.
Written Opinion issued in Intl. Appln. No. PCT/GB2019/052221 dated Oct. 29, 2019.
Copending U.S. Appl. No. 17/266,479, filed Feb. 5, 2021 (a copy is not included because the cited application is not yet available to the public and the Examiner has ready access to the cited application).
Combined Search and Examination Report issued in GB Appln. No. 1721448.7 dated Jun. 20, 2018. Cited in U.S Publication 1.
Combined Search and Examination Report issued in GB Appln. No. 1812826.4 dated Jan. 31, 2019. Cited in U.S. Publication 1.
International Search Report issued in Intl. Appln. No PCT/GB2018/053683 dated May 22, 2019. Cited in U.S. Publication 1.
Written Opinion issued in Intl. Appln. No. PCT/GB2018/053683 dated May 22, 2019. Cited in U.S. Publication 1.
Combined Search and Examination Report issued in GB Appln. No. 1918915.8 dated May 5, 2020. Cited in U.S. Publication 1.
Office Action issued in U.S. Appl. No. 17/266,479 dated Mar. 3, 2022.
Extended European Search Report issued in European Appln. No. 22160075.2 dated Jun. 22, 2022.
Extended European Search Report issued in European Appln. No. 22160076.0 dated Jun. 13, 2022.

\* cited by examiner

COMPUTER INPUT DEVICES

FIELD

The invention relates to sensing systems for computer input devices such as keyboards e.g. QWERTY keyboards, gaming controllers and computer mice.

BACKGROUND

Computer keyboards generally use a mechanical switch or similar contacting device to sense a single striking position of a key wherein the closing of the switch is used to detect a key-pressed event and the opening of the switch is used to detect a key-released event. Thus, these mechanical switches have a binary (on/off) response. Moreover, the physical depression of the key at this actuation (switching) point depends on the mechanical construction of the switch and it is not possible to change the actuation point without changing the switch itself. However, different actuation points corresponding to more or less depression of the key (actuation distance) can be favoured in different circumstances or by different operators. For example, a long actuation distance is often preferred for typing whereas a short actuation distance is often preferred for playing computer games. Another limitation of mechanical switches is a phenomenon known as switch-bounce whereby the contacting and releasing phases of the switching comprise several short-duration contact-release cycles lasting several milliseconds in duration; this limits the response speed of the switches.

Some keyboards use Hall effect sensors where a permanent magnet is moved with respect to a Hall probe to sense the position. Magnetic sensors have reduced sensitivity to contamination by dirt and moisture but they have other flaws including sensitivity to interference from external magnetic fields and from movement of nearby ferrous metals, and to changes in temperature. The sensors also suffer from hysteresis, and the requirement of a permanent magnet and a magnetic sensor on each key makes them expensive.

Gaming controllers are used as input devices for computer games to control the movement and/or actions of a character in the computer games. Typically, game controllers comprise a number of switches each with a binary response that results in movements and/or actions that are either on or off with no control between these extremes. More advanced game controllers, in addition, comprise one or more analogue joystick controls whereby the relative displacement of the joystick from a centre position can be used to control the relative movements and/or actions within a game thus permitting fine control of the character for an improved gaming experience. However, such fine control is only available with the joystick controls but not with the switches.

Computer mice are used as input devices for computers whereby the movement of the mouse, typically on the operator's desk, causes corresponding movements of a cursor (pointer) on the computer screen. In addition, a mouse features one or more buttons connected to switches with a binary response. Although movement of the mouse sends precise positional information to the computer, the buttons can only send binary on/off information regarding the state of the switch.

Although potentially useful, analogue switches for computer input devices are not readily available and have several limitations.

Position sensors used in game controller joysticks are typically potentiometers. However, potentiometers suffer from poor reliability because the potentiometer wiper is constantly in physical contact with the resistive material, which causes wear. Moreover the physical resistance to movement of a potentiometer negatively affects the haptic feel of a switch.

A force sensitive input device for an analogue switch is described in U.S. Pat. No. 8,922,399. This uses optical reflectance as the basis of a position sensor but the method, and optical methods in general, suffer from several limitations including: highly non-linear response to detected position; sensitivity to variations in temperature and ambient light; and sensitivity to contamination by dirt, dust or moisture. Moreover, the optical components and supporting electronics can be expensive.

Capacitive position sensors are sensitive to electro-magnetic interference and to the position of the operator's hands, as well as to temperature, which make their application as the position sensor in an analogue switch impractical.

SUMMARY

In one aspect there is therefore provided a sensing system for a computer input device. The computer input device may be, for example, a computer keyboard, or a mouse, or a joystick, or a game controller (game pad). The computer keyboard may be an alphanumeric keyboard; the symbols may be for a Latin or non-Latin script, and/or may comprise characters in e.g. an East Asian language.

The sensing system comprises a moveable top member or actuator e.g. for a key or button of the computer input device. The actuator may be configured to attach to or may comprise or consist of a key top or button, for a key or button. In some implementations the actuator is moveable along an axis, in particular a linear axis. In some other implementations the actuator is a hinged actuator e.g. hinged at an edge or pivot.

The sensing system may further comprise a biasing element. The biasing element may be a spring or other mechanical linkage which resists movement of the actuator (moveable top member). The biasing element may be configured to exert a biasing force on or against the actuator, directed to bias the passive resonant circuit of the actuator away from the active resonant circuit. Thus the biasing element may be configured to exert a biasing force on the actuator, e.g. directed along the axis.

In implementations the sensing system has an actuator motion sensor associated with the actuator to detect motion of the actuator. The actuator motion sensor may comprise a passive resonant circuit configured to be moved by the actuator and having a resonant frequency, and an active resonant circuit configured to excite the passive resonant circuit at the resonant frequency. The actuator motion sensor may further comprise at least one sensor driver to drive the active resonant circuit with an RF drive signal at the resonant frequency, and at least one detector to detect a level of RF signal from a driven actuator motion sensor i.e. from the driven active resonant circuit, for sensing a position and/or velocity of the actuator associated with the actuator motion sensor.

A computer associated with the computer input, e.g. to which the computer input device is wired or wirelessly connected, may be, for example: a tablet or mobile device, a laptop or a desktop computer, a games console, a computer forming part of an item of industrial or scientific equipment e.g. for industrial or scientific control, or any computerized equipment with a user-operated input device, especially where fine control is desirable e.g. for fine spatial positioning or accurate timing control.

In another aspect a sensing system for a computer keyboard may comprise a plurality of key sensors. Each key sensor may comprise a passive resonant circuit, and an active resonant circuit, the passive resonant circuit having a resonant frequency, the active resonant circuit being configured to excite the passive resonant circuit at the resonant frequency. Optionally a key sensor may comprise an actuator as previously described. The sensing system may further comprise at least one sensor driver to drive the active resonant circuits with an RF drive signal at the resonant frequency. The sensing system may further comprise a multiplexing system. The sensing system may further comprise at least one detector to detect a level of RF signal from a driven key sensor for sensing a position and/or velocity of a key associated with the key sensor. The multiplexing system may be configured such that no key is driven at the same time as an adjacent key in each of two dimensions.

In some implementations a casing is provided for, e.g. enclosing, the actuator, the biasing element, and the passive resonant circuit. The casing, with the actuator, the biasing element, and the passive resonant circuit, may then define an actuator block. The actuator may be configured to enable a push-fit or clip-fit button or key top to be attached to the actuator e.g. onto a projection of the actuator.

The computer input device may have a mounting surface for the actuator block, e.g. a flat or curved mounting plate. For example this may be part of a keyboard or game controller. The actuator block may be configured to be removeably fitted into the mounting surface, e.g. by means of a push-fit or clip-fit, such that one actuator block is exchangeable for another. When the actuator block is fitted into the mounting plate the passive resonant circuit is in operable proximity to the active resonant circuit, that is the actuator block is fitted into the mounting plate so that the sensing system works correctly.

For example the casing may have a catch with a catching position and a releasing position, such that the catch is configured to attach the casing of the actuator block to the mounting surface when the catch is in the catching position and is operable to release the actuator block from the mounting surface.

The casing may have a formation e.g. a lip and the actuator may be configured to move along an axis within the casing. The formation may be configured to act as a stop contain the actuator within the casing e.g. by exerting a normal force on the actuator in a direction against the biasing force.

Such arrangements facilitate removeable/interchangeable keys or buttons. A back plate or PCB (printed circuit board) may carry the active resonant circuit(s). In some implementations the actuator is attached to the biasing element, and the actuator, biasing unit and passive resonant circuit form a single removable unit.

The casing may have a formation which engages with a recess in the back plate or PCB to align the actuator block with the active resonant circuit. In one implementation an external protrusion of the casing defines an internal recess, which may also hold one end of a spring which forms the biasing element.

In some implementations a set of actuator blocks is provided, e.g. for keys of an alphanumeric or other computer keyboard. The actuator blocks may have different mechanical responses to one another. For example the mechanical response of an actuator block may define a force needed to define the sensed position and/or velocity. Thus keys actuator blocks may be exchanged with one another to change the mechanical and/or electrical response of one or more keys of a keyboard or buttons of a game controller. The mechanical response of an actuator block may be modified by changing the biasing element e.g. the strength of the spring, or by changing (internal) deformable end stops of the actuator (see below) e.g. changing the thickness or material of an end stop.

In implementations the actuator has a start position, when the actuator is in a quiescent state, and a depressed position. The sensing system may further comprise a signal processor configured to process the detected level of RF signal to sense a position and/or velocity of the actuator between the start position and the end position, e.g. for determining a key or button response associated with said actuator motion sensor.

The signal processor may be implemented in hardware i.e. electronic circuitry, or in software, e.g. processor control code for a processor such as a microcontroller, or in a combination of hardware and software.

The signal processor may be configured to determine a key or button response by processing the sensed position and/or velocity of the actuator. A data output (and/or input) of the sensing system may use any standard data/communications format e.g. a USB connection. The output data may include intermediate key or button positions/velocities i.e. the sensing system may provide a non-binary key response. A key/button may be determined to have an on-response if the sensed position of the actuator is determined to correspond to a defined actuation position, which may be adjustable to adjust a sensitivity of the response, as described later.

The sensing system may have a deformable end stop for the actuator. The depressed position may be defined by the deformable end stop. The signal processor may be configured to process the detected level of RF signal to sense when force is applied to the actuator to move the actuator beyond the deformable end stop, e.g. to provide an "aftertouch" signal, e.g. a signal which results from pressure on the actuator, i.e. on a key or button, beyond its normal on position.

The processor may be configured to identify an end position without aftertouch, e.g. by factory calibration, and may therefore detect movement of the actuator beyond this position. This may be used on a mouse, keyboard or game controller, where pressure on the key after actuation can give further dimension of control. The key response may be changed by adjusting the biasing element and/or adjusting or selecting the deformable end stop (where present).

The sensing system may comprise a plurality of actuator motion sensors positioned in an array. The sensing system may further comprise a multiplexing system to multiplex the RF drive signals for the actuator motion sensors such that simultaneously driven actuator motion sensors are separated by at least one actuator motion sensor in at least one of two orthogonal directions. The sensor(s) between the separated sensors need not be on a straight line between the separated sensors.

In implementations the sensing system comprises a backplane which bears a plurality of the active resonant circuits, each comprising a respective coil with one or more windings, each for a respective actuator motion sensor. A signal processor (coupled to the detector) may be configured to process the detected level of RF signal to sense a position and/or velocity of the actuator for determining a key or button response associated with the actuator motion sensor. The signal processor may be configurable to (electronically) adjust the key or button response of one or more of the actuator motion sensors, individually or in groups. Thus the sensing system may enable a user to (electronically) configure the sensitivity of the actuator motion sensors to motion such that different ones of the actuator motion sensors are configurable to have different sensitivities to motion. For example an actuator motion sensor may be configured to define how far the actuator is to move until it reaches an "on" position, and/or sensitivity of the actuator motion sensor to position and/or velocity. This can be useful to configure different keys of a keyboard or buttons of a game controller to respond differently.

The sensing system may include non-volatile memory associated with the signal processor to store sensitivity configuration data defining the sensitivity of the actuator motion sensors, individually or in groups. The sensing system may also have an interface to enable e.g. one or more of: user definition of the sensitivity configuration data, import of the sensitivity configuration data, and export of the sensitivity configuration data. For example a user and/or communications interface associated with the sensing system or a computer to which the computer input device is connected may provide a user interface to allow configuration or editing of individual or group key or button responses, and/or sharing of such configuration information by import (download) or export via the communications interface.

In some implementations at least the active resonant circuit comprises a coil with windings in opposite senses, in particular such that the windings in opposite senses are configured to generate magnetic fields in opposite senses to cancel one another. Thus each of the passive resonant circuit and the active resonant circuit may comprise a coil with first and second windings in opposite senses. The first and second windings are on opposite sides of a (linear) axis of the actuator motion sensor.

As previously described, in some implementations the sensing system may include a flat or curved backplane. The backplane may bear a plurality of the active resonant circuits each having a respective coil with one or more windings. At least some of the active resonant circuits may be paired, such that in a pair a configuration of the one or more windings of a coil of one of the active resonant circuits is of opposite sense to a configuration of the one or more windings of a coil of the other of the active resonant circuit. For example in the case of coils with a single winding, the windings may be of opposite senses. in the case of coils with a dual winding the dual windings may be oppositely configured (i.e. each winding may be paired with an opposite sense winding). In a multiplexed system the paired coils may be driven simultaneously.

In some implementations the active resonant circuits may be arranged in spatial groups (blocks). In a spatial group, the one or more windings of the coils of the active resonant circuits may have the same sense. In adjacent spatial groups the one or more windings of the coils of the active resonant circuits may have opposite senses. Within a spatial group the active resonant circuits may be multiplexed such that they are driven sequentially in time, each in turn, e.g. such that only one of the active resonant circuits is driven at a time.

The sensing system may further comprise a temperature-compensation system to temperature-compensate the detected level of RF signal. The temperature-compensation system may be configured to apply an off-resonance drive signal to at least one of the active resonant circuits, may measure a level of the off-resonance drive signal from the at least one detector, and may compensate the detected level of RF signal responsive to the level of the off-resonance drive signal. The multiplexing system (where present) may be configured to multiplex the drive signal such that one of the actuator motion sensors is driven in each of a set of time slots. The temperature-compensation system may then be configured to apply the off-resonance drive signal during an additional time slot to the set of time slots.

There is further provided a backplane for a sensing system as described above. The backplane may bear a plurality of the active resonant circuits each comprising a respective coil with one or more windings. At least some of the active resonant circuits may be paired such that in a pair of the active resonant circuits a configuration of the one or more windings of a coil of one of the active resonant circuits is of opposite sense to a configuration of the one or more windings of a coil of the other of the active resonant circuit.

The backplane may further comprise the sensor driver. The active resonant circuits may be arranged in spatial groups. In a spatial group, the one or more windings of the coils of the active resonant circuits may have the same sense. In adjacent spatial groups the one or more windings of the coils of the active resonant circuits may have opposite senses. Within a spatial group the active resonant circuits may be multiplexed such that they are driven sequentially in time, each in turn.

There is also provided a method of adjusting a key or button response. In one aspect the method configures the actuator motion sensor by replacing the biasing element with a different biasing element, which exerts a different biasing force on the actuator. In another aspect the method comprises replacing a unit comprising the actuator, passive resonant circuit and biasing element, whilst leaving the active resonant circuit, driver, and detector in place.

There is also provided a non-transitory data carrier, such as non-volatile memory, carrying code and/or data to implement functions described above. The code/data may comprise source, object or executable code in a conventional programming language, interpreted or compiled, or assembly code, code/data for setting up or controlling an ASIC or FPGA such as code for a hardware description language such as Verilog (Trade Mark). As the skilled person will appreciate such code and/or data may be distributed between a plurality of coupled components in communication with one another.

Some advantages of implementations of the sensing system for a computer input device such as the switch of a computer keyboard or keyboard switch, a gaming controller, computer mouse are described below.

The actuation point of the switch can be adjusted by changing the positional threshold at which the key-pressed and key-released events are sent. The position of the switch can be used to send joystick-like control events. The rate of change of depressed position (velocity) of the switch can be used to determine how quickly the switch was actuated. If a deformable member is added at the end-stop of the switch, the switch can send pressure events when the position of the end-stop is in contact with the deformable member, distinct from position events which occur whilst the end-stop is not in contact with the deformable member.

Some implementations of a computer input device equipped with the sensing system can: fit within a small form factor; have a fast response time, typically under one millisecond; leave the tactile or haptic response of the switch substantially unaffected; be reliable with a long service lifetime; be insensitive to variation in environmental conditions; and, because switches need not be sealed, be insensitive to contamination by dirt, dust or moisture.

On a computer keyboard, implementations of the sensing system allow the actuation distance of each key to be modified so that the switching point may be chosen to be at any depressed position of the switch. Moreover, this can easily be changed by the operator to suit their preference, or for the task being performed. Similarly, when playing computer games, the real-time position of the key can be used as a joystick-like input device to provide fine control of a game character. The velocity of the key at the actuation point can be used as another input to the computer program. For example, in a computer game where a key is used to action a character to jump, a sensed velocity of the key can be used to control a height of the jump.

On a gaming controller, implementations of the sensing system allow every button or switch to act as a joystick-like input device. For example, in a driving game the joystick may be used for steering and buttons comprising switches connected to the sensing system may be used to control the smoothly-variable acceleration and braking of the simulated car.

On a computer mouse, implementations of the sensing system allow the position of the mouse buttons or pressure applied to the mouse buttons to be used to control aspects of a computer program. For example, in an artwork program the pressure applied to the mouse button may be used to control the weight of a pen or brush to vary the width, intensity, or colour of what is being drawn.

Implementations of the sensing system can provide a mechanical switch for a computer keyboard, game controller, or mouse that requires no direct electrical connection. This can facilitate simple and reliable replacement of the switch, e.g. to permit use of switches with varying actuation force or other varying characteristics that are deemed desirable.

Implementations of the sensing system can further provide a computer keyboard which facilitates adjustment of the actuation force required to depress a key. This may be achieved electronically or by using springs of varying resilience, but in the latter case the keys may be readily removed and replaced after manufacture because there is no direct electrical connection required to the moving part of the key.

Other aspects of the system are described below. These may be combined with those described previously.

Thus in one further aspect there is provided a sensing system for a keyboard, for example a computer keyboard. The sensing system may comprise a plurality of key sensors. Each key sensor may comprise a passive resonant circuit, for example for mounting on a moving part of a key, and an active resonant circuit, for example for mounting in a reference position. In implementations the passive resonant circuit has a resonant frequency and the active resonant circuit is configured to excite the passive resonant circuit at the resonant frequency. The sensing system may further comprise at least one sensor driver to drive the active resonant circuit with an RF drive signal at the resonant frequency; this may be shared between multiple sensors. In implementations the sensing system may further comprise a multiplexing system such as one or more multiplexers and/or demultiplexers, to multiplex the drive signal and to demultiplex the output signal from a driven key sensor. The sensing system may further comprise at least one detector, for example readout-circuitry and/or a microprocessor, to detect a level of RF signal from a driven key sensor. This may be used for sensing a position and/or velocity of a key associated with the key sensor. The at least one detector may detect variation of a resonant RF signal in the active resonant circuit with relative position of the active and passive resonant circuits; it may peak-detect the level of RF signal.

At least the active resonant circuit, and optionally also the passive resonant circuit, may comprise one, two or more coils, in particular with windings in opposite senses. Thus, for example, the windings may generate magnetic fields in opposite senses, in particular balanced or matched to cancel one another, in particular at long distances from the sensor In implementations the combination of coils with opposite sense windings (and hence opposite sense currents/magnetic fields) and multiplexed sensor addressing facilitates the use of multiple sensors in close proximity. Thus in implementations the windings in opposite senses are configured to generate balanced magnetic fields in opposite senses, which may cancel one another substantially completely at large distances from a sensor, for example at a distance of at least ten times a maximum coil dimension (which is not to say that the RF field from a sensor is undetectable at such a distance).

In some implementations the active resonant circuit comprises a pair of, or three or more, laterally adjacent pancake coils. (As used herein references to two or more coils may be taken to include one coil with two or more windings, for example where the windings are in opposite senses). The coils may be positioned next to one another longitudinally along a longitudinal direction defined by a key. The pancake coils may be formed on a printed circuit board (PCB), which may be a flexible PCB, for ease of fabrication. The coils may, but need not have windings in opposite senses—some reduction in mutual interference may be obtained simply by employing this configuration of coils.

In implementations system, in particular the multiplexing system, is configured to damp the active resonant circuits of key sensors which are not driven, for example by shorting a coil/sensor and/or driving it with an off-resonance signal, e.g. a low frequency or DC signal. This also facilitates using resonant circuit-based sensors by reducing interference between sensors.

One or more of the above described techniques may be employed to limit interference between nearby sensors. Which, and how many, techniques are employed may depend in part upon the distance between the active and passive resonant circuits when a key is up and/or the distance of travel between key up and key down positions. For example in a computer-style keyboard the travel may be in the approximate range 1 mm to 6 mm depending upon the design. With larger distances pressing one key may result in seeing another nearby key move, and thus one or more of the above techniques may be beneficially employed to ameliorate this effect. Thus in general, some implementations of the sensing system may employ a multiplexing arrangement as described herein and some additional means to reduce interference between nearby sensors.

The sensing system may further comprise a temperature-compensation system to temperature-compensate the detected level of RF signal. The temperature-compensation system may be configured to apply an off-resonance drive signal to at least one of the active resonant circuits. It may then measure a level of the off-resonance drive signal from the at least one detector, and it may then compensate (e.g. offset) the detected level of RF signal responsive to the level of the off-resonance drive signal. In some implementations the multiplexing system is configured to multiplex the drive signal such that one of the key sensors is driven in each of a set of time slots. Then the temperature-compensation system may be configured to apply the off-resonance drive signal during an additional time slot, in particular a time slot not used for key interrogation.

In some implementations each key sensor may further comprises a resilient deformable element, for example below one of the resonant circuits, for example a deformable end stop, or between the resonant circuits, in particular to limit motion of one or both of the passive resonant circuit and the active resonant circuit for pressure sensing, in particular by detecting motion against the resilient deformable element.

In a related aspect there is provided a method of periodically compensating a response of a keyboard. Each key of the keyboard may have a sensor comprising an active resonant circuit, a passive tuned resonant circuit and a detector. The method may comprise retrieving from storage a detected initial output signal of the sensor, Oto, at a first time, to, wherein at to the active resonant circuit is being driven at a frequency below a resonant frequency of the active resonant circuit. The method may further comprise, periodically, for at least one of the sensors, detecting a later output signal of the sensor, Oil, at a time after to. The method may then calculate an adjustment value, for example a difference between the initial output signal of the sensor and the later output signal of the sensor. The method may then further comprise compensating the response of the keyboard by adjusting an operational output of the sensor using the adjustment value. The operational output may be an output from the sensor when the active resonant circuit is being driven at the resonant frequency of the active resonant circuit. The method may further comprise operating the sensor according to a time division multiplexed addressing scheme. The method may then use a "spare" time slot of the time division multiplexed addressing scheme, in which the sensor is not operational, for the detecting.

In another aspect there is provided a set of sensors for a keyboard, in particular a computer keyboard. The keyboard has a plurality of keys. The set of sensors may be part of a sensing system. Each sensor may comprise a passive resonant circuit for mounting on a moving part of a key and an active resonant circuit for mounting in a fixed, reference position, for example on part of the keyboard. In implementations the passive resonant circuit has a resonant frequency and the active resonant circuit excites the passive resonant circuit at the resonant frequency. Each sensor may further comprise a detector, which may be shared between multiple sensors, to detect variation of a resonant signal in the active resonant circuit with relative position of the active and passive resonant circuits to thereby detect a position and/or velocity of the key. The variation may, in some implementations, be a variation in amplitude of signal in the resonant signal. The set of sensors may comprise sensors having two or more different resonant frequencies arranged such that sensors having the same resonant frequency are non-adjacent when mounted to sense keys of the keyboard.

Embodiments of this approach can be relatively inexpensive to construct but are also reliable and not prone to the key bounce of mechanical switches, which in turn enables them to respond to key movements very quickly and reliably. For example ideally each key would be measured at a rate of at least 250 times per second, and on a 101 or 104-key keyboard this corresponds to approximately 26,000 keys/second. Some implementations of the described system can operate at well over ten times this speed. Embodiments of the system can also provide excellent temperature stability, and are non-contact so robust and substantially immune to contamination. Some implementations of the sensors are further able to determine a key position as it moves between key-pressed and key-released positions, and may provide a substantially continuous determination of key position. The reference position may be a fixed position beneath the key, for example on a keyboard base or mount or it may be a position on a printed circuit board (PCB) carrying the set of sensors for the keyboard. Alternatively however, in some implementations the active resonant circuit may be mounted on or in association with a key and the resonant circuit may be mounted on the base, PCB or similar.

Some implementations of the sensors are also able to detect when a key moves beyond a key pressed position, and hence are useful in implementing detection of the pressure applied to a key.

The sensors can further sense key velocity, and/or sensed key velocity may be employed to determine key position.

In some implementations sensors having a first resonant frequency are interleaved with sensors having a second, different resonant frequency, for example using alternate frequencies on alternate keys. This helps to reduce inter-sensor interference.

The set of sensors may include a controller to control selection or scanning of the sensors such that adjacent keyboard sensors are selected at different times, again to reduce inter-sensor interference. In some implementations the controller may damp the response of active resonant circuits of unselected sensors, for example by connecting part of the active resonant circuit to ground, for example via a resistor. The controller may comprise a multiplexing system and/or a microprocessor.

In some implementations the controller/multiplexing system may be configured to time division multiplex operation of the sensors. In such an approach each resonant frequency may define a group of sensors, and the time division multiplexing may define a plurality of n time slots. Successive keyboard sensors, for example of each group, are allocated successive time slots. The successive sensors, for example of each group, may be non-adjacent on the keyboard if sensors of the groups of sensors are interleaved. There may be N resonant frequencies and thus N groups of sensors; In some implementations N=1. In some implementations, after activating a sensor of a current group of sensors in a current time slot the controller may in the next time slot activate the next sensor along the keyboard which is in the same group of sensors.

Preferably the controller/multiplexing system is configured such that adjacent sensors are not active simultaneously, although next-to-adjacent sensors may be active simultaneously. The spacing between simultaneously active sensors may be (m×N)+1 where m is in the range 1 to n/2; higher separations are preferred (where a spacing of 1 refers to adjacent sensors).

The closest physical spacing for simultaneously active sensors in the same group may be a spacing of n×N sensors, later referred to as a subset of sensors, since typically a keyboard will have more than one such subset. Thus the controller/multiplexing system may be configured such that keyboard sensors in the same group and activated in the same time slot have (n×N)−1 sensors between them. In some implementations n may be 8 and N may be 2.

The controller may be implemented using a processor coupled to an addressing device such as a digital demultiplexer to address the sensors; a signal may be read from the addressed sensors by selectively connecting a sensor active resonator to a read-out circuit via an analogue multiplexer. The detector, i.e. read-out circuit, may perform an envelope detect function. The read-out circuit and/or analogue multiplexer may be enabled by an enable signal derived from a drive signal to an active resonator, in some implementations via an adjustable phase shift. The adjustable phase shift may be used, in the context of or separately from such a demultiplexer-multiplexer arrangement, to implement synchronous detection of the signal from an active resonant circuit.

The controller or another processor may be configured to process the variation of the resonant signal in the active resonant circuit of each sensor to determine the motion of each key of the keyboard over a succession of time intervals as a depressed key moves between released and depressed positions, when a key is depressed and/or released. The motion of each key may comprise a position and/or an approximate velocity of the key as the key moves between released and depressed positions.

In some approaches the position of a key may be determined from the velocity of a key, for example by integration, rather than directly. The processor may output data defining a profile of approximate position and/or velocity over time for each key or for each moving key.

In some implementations the processor is configured to process the variation of the resonant signal in the active resonant circuit of each sensor to determine the approximate velocity of a key from changes in position of the key determined at successive time intervals. A velocity determined in this way may be filtered dependent upon key velocity, for example applying greater filtering/smoothing when a key is moving slowly. This helps to provide accurate data when a key is moving slowly without significantly compromising the response time for a fast-moving key.

More generally a processor may process the amplitude and/or other variation of the resonant signal to determine a key-pressed and key-released event for each key, for example from a determination of key position and/or velocity. The processor may thus output a press/release event signal for each key/each active key.

In some approaches the succession of key positions or key movement profile may be used to predict when a pressed (or released) key reaches a key-pressed (or key-released) position, for example by extrapolating a trajectory of the key position. The predicted position may be the position later referred to as K. The processor may then issue a key-pressed (or key-released) signal in advance of the actual key-pressed (or key-released) position being reached. This can be advantageous for compensating in processing delays, for example latency in a computer game.

In some implementations the succession of key positions or key movement profile may be used to provide signals to the computer, for example to control the movement of a computer game character, before and/or after a key-pressed event has been issued, or instead of issuing key-pressed and key-released events.

In some implementations the processor may be further configured to distinguish between at least three different key positions, a first, key-released position, a second, key-pressed position, and a third, aftertouch position. The aftertouch position may be beyond the key-pressed position and correspond to additional pressure applied to the key after depression. The processor may determine a position and/or velocity of the key as it moves to/from the aftertouch position, for example to act as a variable pressure sensor, or the processor may simply identify when the aftertouch position is reached. The aftertouch position may correspond to motion of a key beyond its usual depressed position as a result of the application of additional pressure to the key. Each key may be provided with a resilient bias or deformable end-stop device such as a compression or tension spring or compressible element or block, so that on depression part of the key interacts with the device and is inhibited from further motion by the device unless additional pressure is applied to the key, whereupon the key moves towards its aftertouch position. An aftertouch position may be detectable for each key.

A pressure-control key movement distance (dead-zone) may be provided between a maximum key-pressed position and the start of aftertouch detection, for example to allow the amount of pressure required before aftertouch begins to be configured.

The set of sensors may be provided on a substrate such as a printed circuit board. The sensors may be disposed in a two-dimensional array along the substrate, in particular at locations which correspond to locations of keys of the keyboard, more specifically adjacent where the passive resonant circuits are located on the keys. Coils for the active resonant circuits may be formed by tracks on the substrate, for example defining pancake coils. A set of sensors may comprise sensors for a complete keyboard or for part of the length of a keyboard. There is also provided a keyboard comprising one or more the sets of sensors as previously described.

In general a processor/controller of the set of sensors may be any sort of processing device/circuitry, for example comprising one or more of: a microprocessor under program code control, or a digital signal processor (DSP), or hardware such as an FPGA (field programmable gate array) or ASIC (application specific integrated circuit). In some implementations the control/processing functions for a set of sensors may be provided in a single integrated circuit.

Where a programmable device is employed the processor may have associated working memory and non-volatile program memory storing processor control code to control the processor to implement some or all of the functions described above. Thus there is also provided a non-transitory data carrier, such as non-volatile memory, carrying code and/or data to implement functions described above. The code/data may comprise source, object or executable code in a conventional programming language, interpreted or compiled, or assembly code, code/data for setting up or controlling an ASIC or FPGA such as code for a hardware description language such as Verilog (Trade Mark). As the skilled person will appreciate such code and/or data may be distributed between a plurality of coupled components in communication with one another.

There is also provided a method of sensing the positions of a plurality of keys, for example of a computer keyboard. The method may comprise providing each key with a sensor comprising a passive resonant circuit for mounting, for example, on a moving part of a key and an active resonant circuit for mounting, for example, in a fixed, reference position, for example part of the keyboard. In some implementations the passive resonant circuit has a resonant frequency, the active resonant circuit exciting the passive resonant circuit at the resonant frequency. Each sensor may further have a detector, which may be shared, to detect variation of a resonant signal in the active resonant circuit with relative position of the active and passive resonant circuits to detect a position and/or velocity of the key. The method may further comprise arranging the sensors to operate at two or more different resonant frequencies arranged such that keyboard sensors having the same resonant frequency are non-adjacent. Additionally or alternatively and/or the method may further comprise reducing interference between sensors by configuring one or more coils of at least the active resonant circuits, and optionally also of the passive resonant circuits, to have windings in opposite senses.

The method may further comprising providing per-key aftertouch by distinguishing between at least three different key positions, a first, key-released position, a second, key-pressed position, and a third, aftertouch position, wherein the aftertouch position is beyond the key-pressed position and corresponds to additional pressure applied to the key after depression and movement of a key beyond an end-stop position.

There is further provided a keyboard, in particular a computer keyboard providing an output signal derived from measurements of the position and of the velocity and of the pressure applied to a plurality of moveable keys on the keyboard. The measurements may be derived from actuator motion sensors on the moveable keys. Each actuator motion sensor may comprise an active tuned resonant circuit; drive electronics coupled to the active tuned resonant circuit to drive the active tuned resonant circuit at a resonant frequency, optionally shared between sensors; and an electrically reactive element associated with the moveable key. The electrically reactive element may provide a variable modification to a response of the active tuned resonant circuit dependent on a relative position of the electrically reactive element with respect to the active tuned resonant circuit. The keyboard may further comprise read-out electronics coupled to the active tuned resonant circuit, to provide a variable output signal responsive to the relative position of the electrically reactive element with respect to the active tuned resonant circuit. The variable output signal of the read-out electronics may provide the actuator motion sensor output.

Preferably, but not essentially, the electrically reactive element comprises a passive tuned resonant circuit tuned to a frequency at which the active tuned resonant circuit is driven, thus the actuator motion sensor is operated at a single resonant frequency. Advantages to this approach include: Firstly, a larger effective sensing distance can be achieved for a given size of actuator motion sensor. Secondly, a larger variation in the output signal of the actuator motion sensor for a given variation in sensed position can be obtained, often removing the requirement of an output amplifier for the actuator motion sensor and thus reducing complexity and cost. Thirdly, operation of a plurality of proximally located actuator motion sensors is facilitated because the inventors have found that a passive tuned resonant circuit of a first actuator motion sensor tuned to the resonant frequency of the first actuator motion sensor does not substantially affect the output of a second actuator motion sensor if the second actuator motion sensor is tuned to a significantly different resonant frequency to that of the first actuator motion sensor.

In broad terms an example range of resonant frequencies is 1-10 MHz, balancing speed against the deleterious effect of parasites. For example a first resonant frequency may be in the range 3-4 MHz and a second resonant frequency may be in the range 4-5 MHz.

A particularly advantageous means of forming coils used by the active tuned resonant circuit and passive tuned resonant circuit has been found to be a flat or planar coil defined by tracks on a printed circuit board. This helps achieve a well-defined repeatable geometry and facilitates other electrically active components being proximally located on the printed circuit board.

To minimise electro-magnetic emissions radiated from the actuator motion sensor and to minimise susceptibility to electro-magnetic interference signals of the actuator motion sensor, the coils of the active tuned resonant circuit may be formed from a plurality of electrically connected primary "smaller" coils wherein the winding direction of the primary smaller coils is chosen such that the sum of the electromagnetic far field radiated from the primary smaller coils is substantially zero. In this case the inductance coils used by the passive tuned resonant circuit may: be inductively coupled to only a subset of the primary smaller coils; or be comprised of a plurality of electrically connected secondary smaller coils wherein the winding direction and number of the secondary smaller coils may be chosen to maximise the variation in the output signal of the actuator motion sensor.

Although the above described systems and methods are particularly advantageous for use with keyboards their applications are not restricted to keyboards.

BRIEF DESCRIPTION OF THE DRAWINGS

In the Figures some like elements are indicated by like reference numerals.

DETAILED DESCRIPTION

Figure 1A:
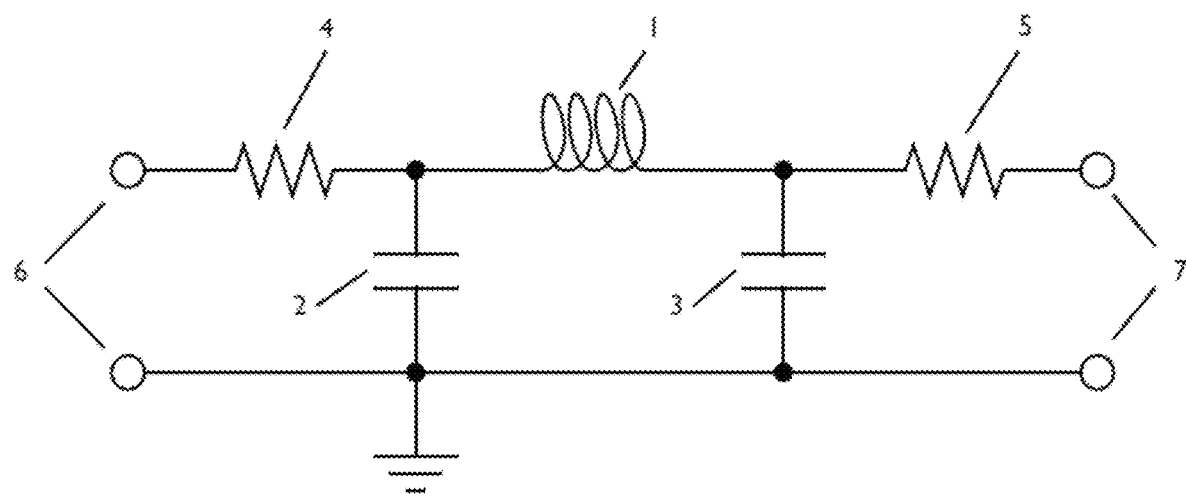
FIGS. 1a and 1b show, respectively, an active tuned resonant circuit and a passive tuned resonant circuit for use with example implementations of the system.

Referring to FIG. 1a, an active tuned resonant circuit comprises an input resistive element 4, a coil 1, two capacitive elements 2 and 3, an output resistive element 5, a means of connecting 6 drive electronics to the input resistive element and a means of connecting 7 read-out electronics to the output resistive element. The input resistive element may be omitted, but it is preferred because: it limits the current supplied to the active tuned resonant circuit from the drive electronics which reduces the operating current and thus reduces both power consumption and electro-magnetic emissions from the active tuned resonant circuit; and it increases the sensitivity of proximity detection when the read-out electronics are connected to the active tuned resonant circuit. The output resistive element may be omitted, but it is also preferred because the input and output resistive elements reduce the effect of connecting wires on the impedance of the active tuned resonant circuit thus allowing all the actuator motion sensors to be essentially the same regardless of the length of connections to the drive electronics and to the read-out electronics.

Figure 1B:
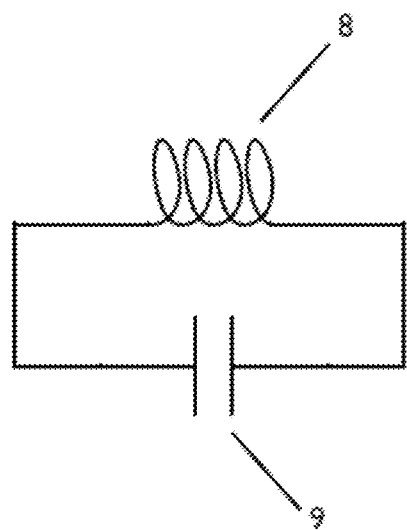

Referring to FIG. 1*b*, the reactive element preferably comprises a passive tuned resonant circuit which comprises a coil 8 and a capacitive element 9 wherein the coil and the capacitive element are connected to form a closed resonant LC circuit. It is not necessary for the size nor for the value of inductance of the coils 1 and 8 to be substantially similar. The value of the capacitance of the capacitive element 9 is preferably chosen to tune the frequency of resonance of the passive tuned resonant circuit to match the frequency of resonance of the active tuned resonant circuit of FIG. 1*a*. When the passive and active circuits are thus tuned, it is possible to operate a plurality of actuator motion sensors where proximally located the actuator motion sensors are tuned to substantially different frequencies of resonance thereby minimising the interaction between the proximally located actuator motion sensors. Furthermore when the passive and active circuits are thus tuned the signal amplitude at output 7 in FIG. 1*a* decreases as the distance between the passive and active circuits decreases because more energy is coupled to and dissipated by the passive tuned resonant circuit. Such variation in the signal amplitude is preferred because measuring variations in signal amplitude is faster than measuring variations in frequency of resonance as would be implemented in the case where the active tuned resonant circuit was detuned by proximity to the reactive element.

The drive electronics comprises a generator of an oscillating voltage drive waveform at a frequency equal to or close to the frequency of resonance of the active tuned resonant circuit. Typically, by way of example, this waveform is a square waveform generated by the output of a microcontroller timer or a digital or analogue timing circuit.

The read-out electronics comprise a means of generating a voltage proportional to the amplitude of the signal at the read-out point 7.

Figure 2:
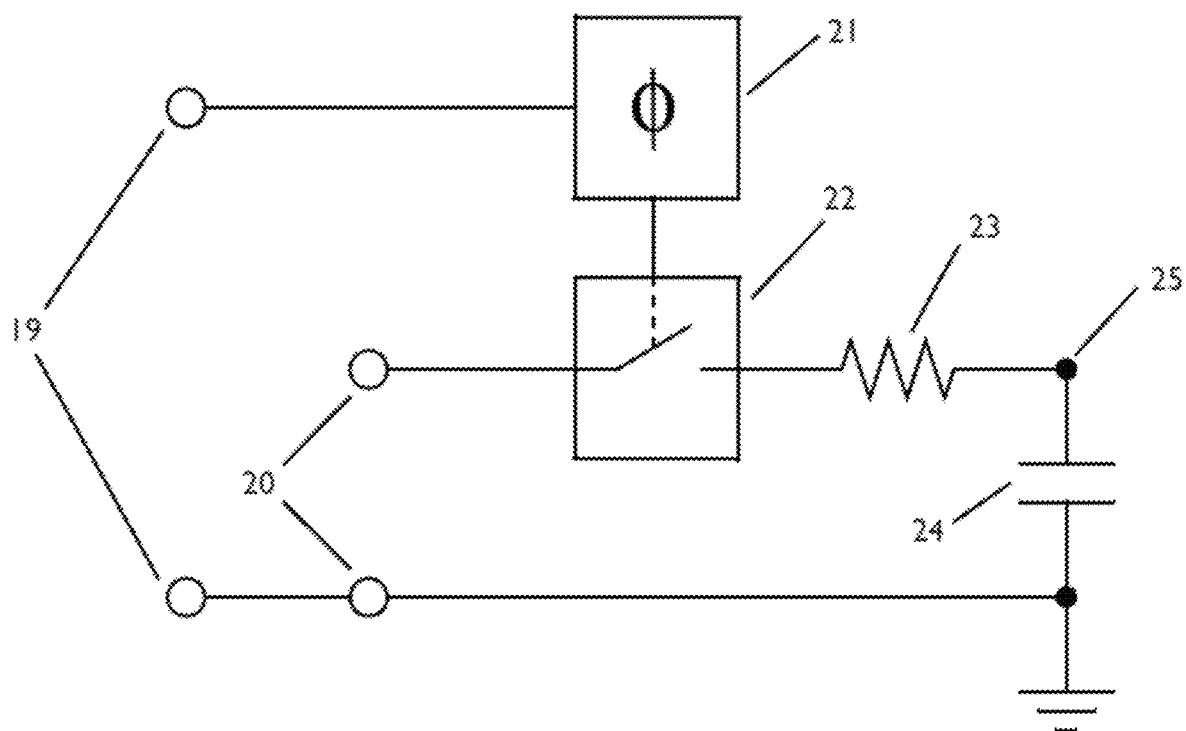
FIG. 2 shows an example of a read-out electronic circuit comprising a synchronous demodulator for use in example implementations of the system.

Referring to FIG. 2, by way of example, the read-out electronics may comprise a synchronous demodulator circuit. For example the signal from the read-out point is connected to point 20 and demodulated e.g. by an analogue switch 22 controlled by the oscillating voltage drive waveform connected to 19 whose phase is optionally adjusted by a phase shifting element 21. A low-frequency (or dc) voltage is presented at output point 25 by a low-pass filter e.g. comprising a resistive element 23 and a capacitive element 24. Alternative read-out electronic circuits may comprise phase-sensitive rectifiers, phase-insensitive rectifiers, non-synchronous demodulators, peak detectors, or the like.

The coils 1 and 8 used in the active tuned resonant circuit and the passive tuned resonant circuit respectfully can be of any type. However using planar spiral coils formed by tracks on a printed circuit board has three main advantages: they are inexpensive, they can be made with highly reproducible values of inductance and the printed circuit board can also be used to mount the other components, namely the capacitive elements 2, 3 and 9, and the resistive elements 4 and 5. It is therefore possible to design a plurality of coils whose inductance values are closely matched.

Figure 3A:
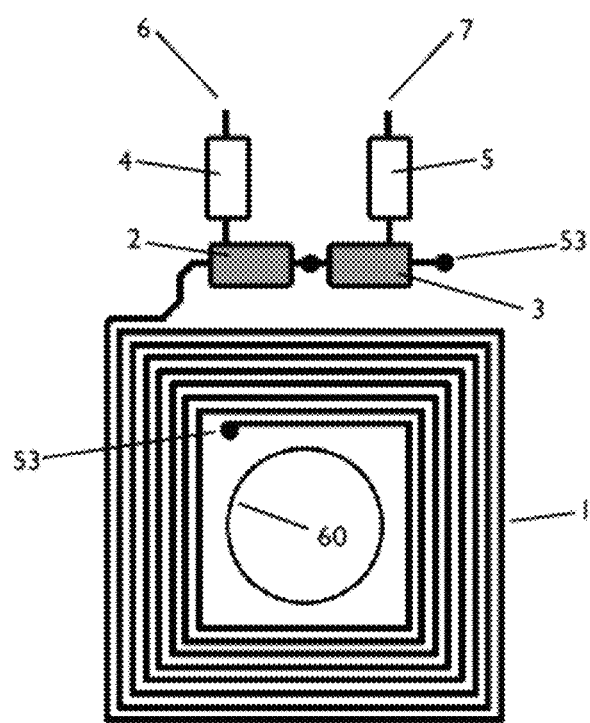
FIGS. 3a and 3b show, respectively, example printed circuit designs for the active tuned resonant circuit and for the passive tuned resonant circuit.

Referring to FIG. 3*a*, an example active tuned resonant circuit may be formed on a printed circuit board comprising a single electrically conductive layer or a plurality of electrically conductive layers. In implementations the coil 1 is formed of a continuous spiral track whereby electrical continuity of the track is maintained by electrical connection through connecting vias 53 to a connecting wire or to another spiral track on another conductive layer or to a plurality of spiral tracks on a plurality of conductive layers of the printed circuit board; capacitive elements 2 and 3 and resistive elements 4 and 5 are proximally located; and connection points 6 and 7 are provided for drive electronics and read-out electronics, respectively.

In some implementations e.g. where a keyboard comprises a plurality of removeable actuator blocks, the active tuned resonant circuit may be formed on a backplane. The backplane may comprise a printed circuit board. In some implementations the backplane is provided with an aperture 60 to accommodate part, e.g. a projection, of an actuator block, for alignment.

Figure 3B:
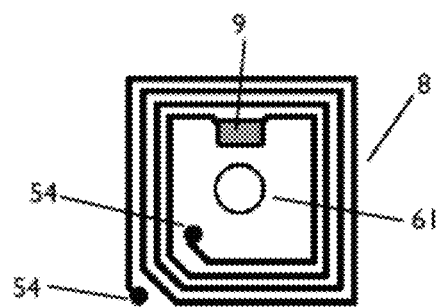

FIG. 3*b* shows an example passive tuned resonant circuit that may be formed on a printed circuit board comprising a single electrically conductive layer or a plurality of electrically conductive layers. In implementations the coil 8 is formed of a continuous spiral track whereby electrical continuity of the track is maintained by electrical connection through connecting vias 54 to a connecting wire or to another spiral track on another conductive layer or to a plurality of spiral tracks on a plurality of conductive layers of the printed circuit board; and the capacitive element 9 is proximally located.

In some implementations the passive tuned resonant circuit forms part of an actuator block and may be formed on a printed circuit board. The printed circuit board may have an aperture 61 to facilitate mounting of the printed circuit board e.g. onto a moveable top member of the actuator block as described later.

The electro-magnetic emissions from an active tuned resonant circuit, and the susceptibility to electro-magnetic interference signals of the active tuned resonant circuit can be substantially reduced when the inductive coil of the active tuned resonant circuit is formed from a plurality of electrically connected primary smaller coils wherein the winding direction of the primary smaller coils is chosen such that the sum of the electro-magnetic far field radiated from the primary smaller coils is substantially zero.

Figure 4A:
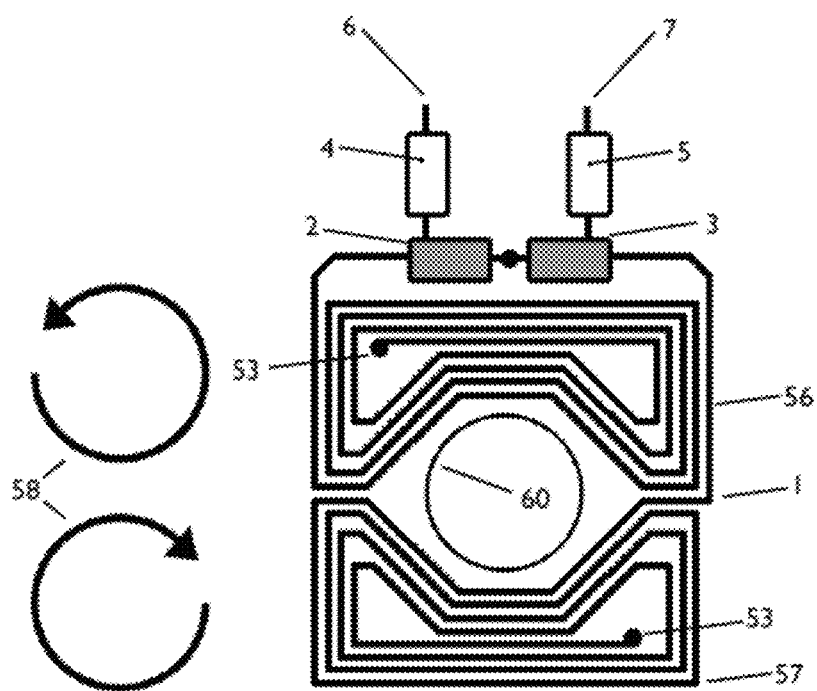
FIGS. 4a and 4b show examples of sensor resonant circuits with coils having windings in opposite senses for, respectively, the active tuned resonant circuit and the passive tuned resonant circuit, for use in a keyboard comprising key assemblies.

One example of the inductive coil 1 is shown in FIG. 4*a*, wherein two primary smaller coils are wired in series with opposing winding directions 58 to form, approximately, a figure-of-eight coil. In such an arrangement the electro-magnetic far field radiated from the first half of the figure-of-eight coil 56 is equal in magnitude but with opposite polarity to the electro-magnetic far field radiated from the second half of the figure-of-eight coil 57, thus the electro-magnetic far field radiated from the figure-of-eight coil is substantially zero.

In such an arrangement, a passive tuned resonant circuit as shown in FIG. 3*b* may be ineffective unless the inductive coil of the passive tuned resonant circuit is primarily inductively coupled to only one half 56 or 57 of the figure-of-eight coil of the active tuned resonant circuit.

Figure 4B:
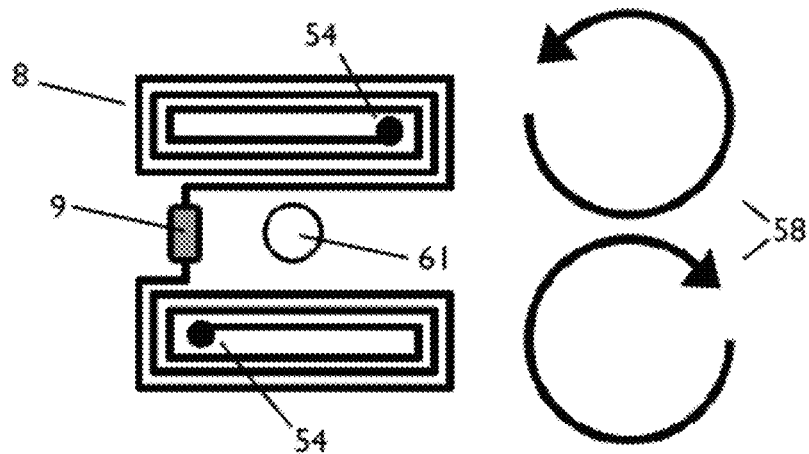

To maximise the output signal of the actuator motion sensor, the inductive coil of the passive tuned resonant circuit may be similarly formed of a figure-of-eight inductive coil, as shown in FIG. 4b, e.g. comprising two secondary smaller coils wired in series with opposing winding directions 58 wherein each the secondary smaller coil is primarily inductively coupled to a different primary smaller coil of the figure-of-eight coil of the active tuned resonant circuit.

Although a first passive tuned resonant circuit tuned to a first frequency of resonance of a first active tuned resonant circuit does not substantially affect the output of an adjacent second active tuned resonant circuit tuned to a substantially different second frequency of resonance, when a corresponding second passive tuned resonant circuit tuned to the second frequency of resonance is proximally located, movement of the first passive tuned resonant circuit may affect the output of the second active tuned resonant circuit due to mutual coupling between the first and second passive tuned resonant circuits. Such undesirable interaction can be minimised by offsetting the positions of physically adjacent passive tuned resonant circuits from a position they would otherwise occupy.

In some implementations the actuator motion sensors on the moveable keys of a keyboard are interrogated using a time-division multiplexing scheme in which a subset of actuator motion sensors are enabled at any given time. For a typical keyboard with a large number of keys such as 16 or more, such a scheme can have advantages of reducing cost, complexity, power consumption and electro-magnetic emissions.

In the case where a first actuator motion sensor operating at first frequency of resonance and a second actuator motion sensor operating at a substantially different second frequency of resonance are proximally located the actuator motion sensors can interact in such a way that the output of the first actuator motion sensor and the output of the second actuator motion sensor contains interference components which vary with a frequency of variation equal to the frequency difference of the first frequency of resonance and the second frequency of resonance. Synchronous demodulation of the output of the actuator motion sensors substantially removes the interference components when the cut-off frequency of the reconstruction low-pass filter is substantially lower than the frequency difference. However, the time response of the low-pass filter can limit the speed of response of the actuator motion sensors which is undesirable. Therefore, a mechanism to minimise this interference is desired. Using a time-division multiplexing scheme where physically adjacent sensors are not driven at the same time can avoid this problem.

However in practice it has been found that synchronous demodulation is not necessary for good performance.

In implementations where more than one active tuned resonant circuit is driven simultaneously, to reduce electro-magnetic emissions it can be advantageous to configure the winding direction of coils of the active tuned resonant circuits such that when simultaneously driven a proportion e.g. half of the coils have windings in one direction and the remaining the coils have windings in the opposite sense. Thus the sum of the electro-magnetic far field radiated from the coils may be substantially reduced compared to the coils all being wound in the same sense.

Figure 5:
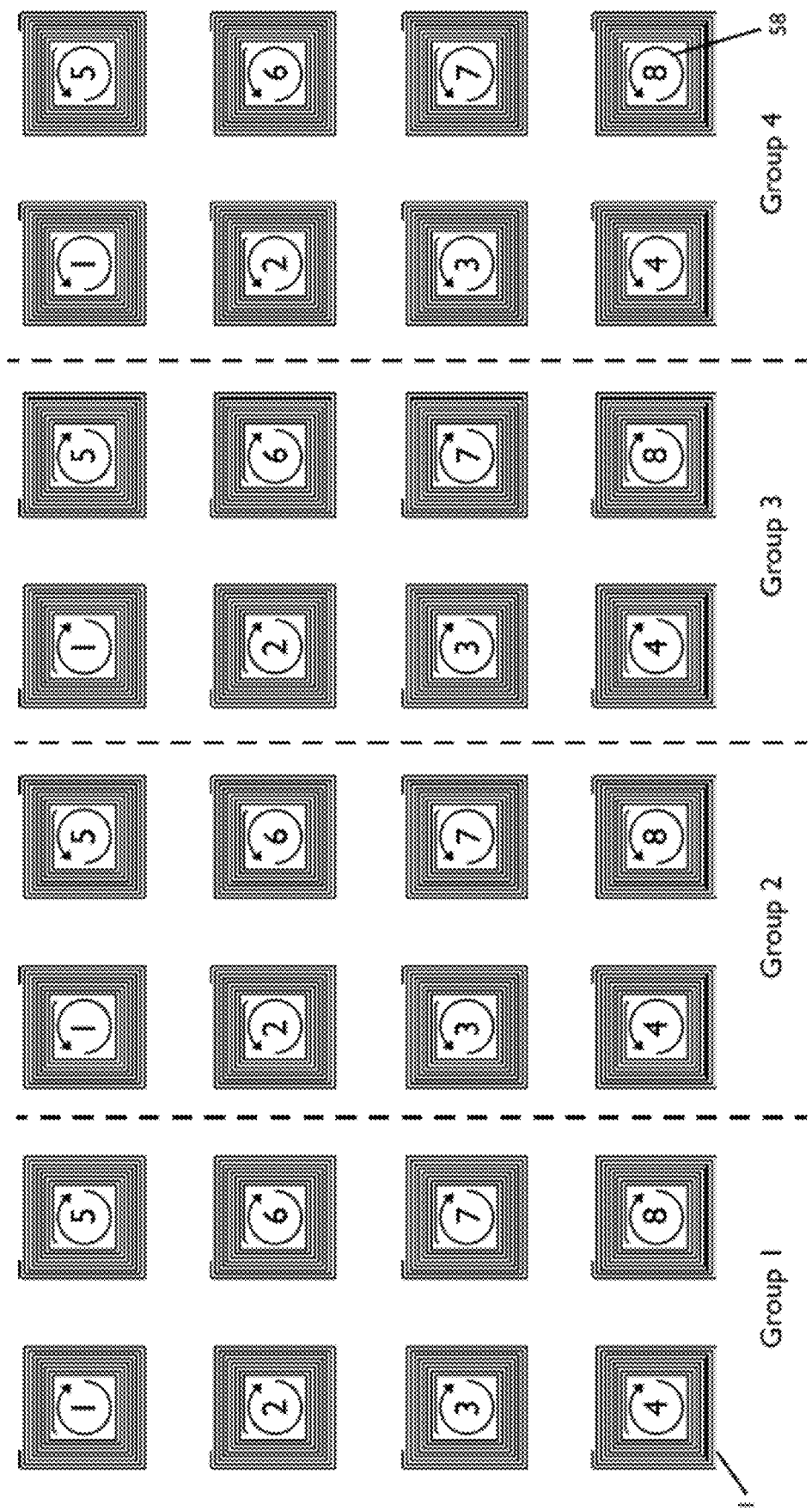
FIG. 5 shows an example printed circuit design for coils of active tuned resonant circuits for a computer keyboard in which simultaneously active pairs of coils are wound in opposing directions.

Thus FIG. 5 shows, schematically an arrangement of coils of the active tuned resonant circuits of a computer keyboard e.g. a printed circuit board; an example keyboard is described later with reference to FIG. 6. The active tuned resonant circuits are driven by a time-division multiplexing scheme in which the numbers in the coils indicate the time-slot during which each coil is driven. The winding direction 58 of each coil is also indicated. The coils are grouped. Consider Group 1 and Group 2: in each time-slot only two coils are active and these are wound in opposite senses. Similarly in Group 3 and Group 4, in each time-slot only two coils are active and are wound in opposite senses. Such an arrangement can be extended to an arbitrary number of groups and time-slots and thus to an arbitrary number of keys on a keyboard. A majority of the coils of the active tuned resonant circuits have a corresponding coil wound in opposite sense, to promote far-field cancellation of electro-magnetic radiated emissions.

An example implementation of the described sensing system is now described, comprising a keyboard with a plurality of keys.

Figure 6A:
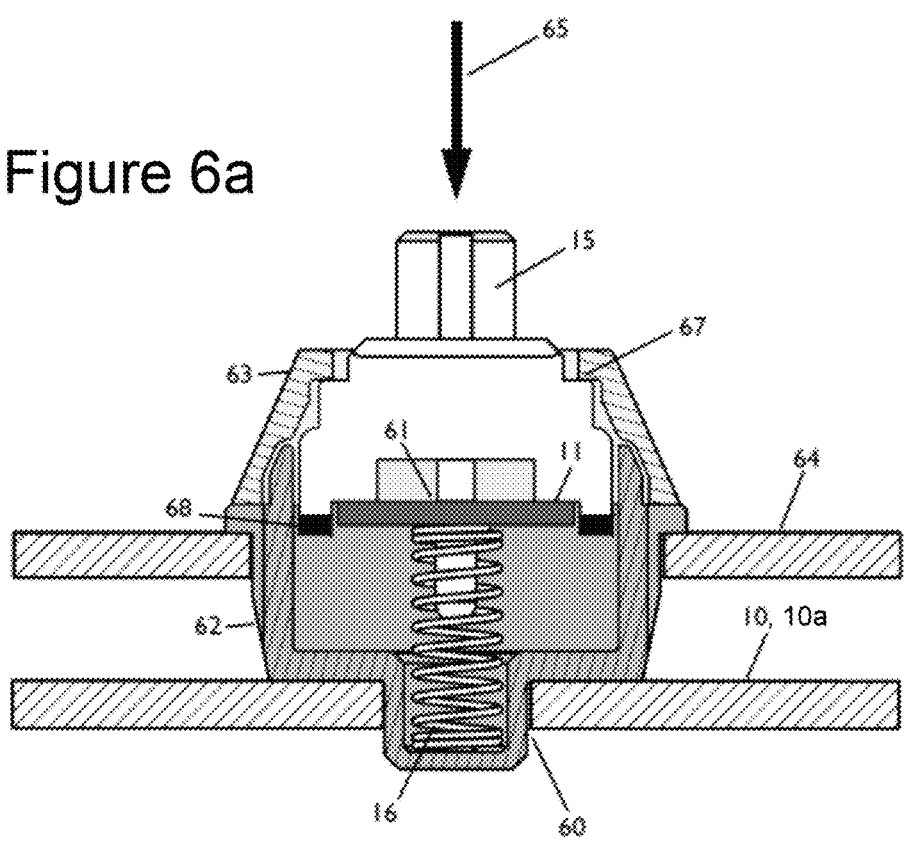
FIGS. 6a to 6d show, respectively, a cross-sectional view of an actuator block for a keyboard key, an isometric view of the actuator block, a computer keyboard comprising the actuator blocks, and an example of a hinged actuator for a computer keyboard.
Figure 6B:
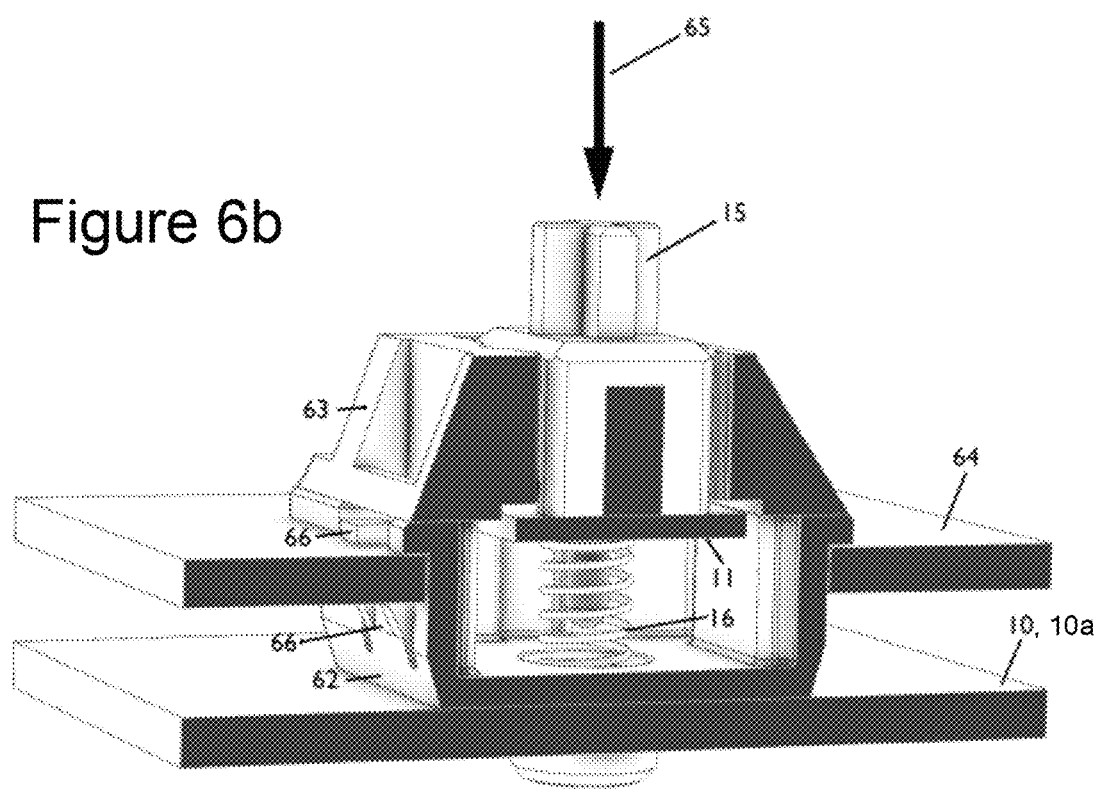

Thus FIG. 6a and FIG. 6b show a sensing system for a computer input device, as illustrated a key of a keyboard, omitting the electronics which may be as described earlier. Similar arrangements may be employed for e.g. a button of a game controller or for a computer mouse. The arrangements of FIGS. 6a and 6b may be described as key assemblies.

The computer input device may include a casing for the actuator of the device; the casing may comprise an upper housing part 63 and a lower housing part 62. The sensing system comprises an actuator 15, which may be constrained by the casing to travel along an axis of movement 65. The actuator 15 may be configured to be attached to, or to comprise, a key or button. For example in FIG. 6 the top of the actuator 15 has a cross shape which is suitable for attaching to a key top or button.

The actuator 15 resists movement by means of a biasing element 16. The biasing element may be a spring or other biasing element and biases the actuator 15 along the axis 65, to separate the active and passive resonant circuits (described later). The casing have comprise a lip or other retention mechanism 67 to retain the actuator within the casing. The sensing system may include a deformable end stop 68 to limit the movement of the actuator.

The sensing system has an actuation motion sensor comprising an active tuned resonant circuit 10, as illustrated on a backplane 10a, inductively coupled to a passive tuned resonant circuit 11. The passive tuned resonant circuit 11 is configured to be moved by the actuator 15. In implementations the passive tuned resonant circuit 11 is attached to a moveable top member of the actuator 15. The actuation motion sensor provides an RF signal which varies as the mutual separation of the active tuned resonant circuit 10 and the passive tuned resonant circuit 11 is varied. Drive and read-out electronics are connected to the active tuned resonant circuit 11. As described above the RF signal can be processed to determine a position and/or velocity of the actuator associated with the actuator motion sensor.

In implementations, the device casing defines an actuator block. In implementations the actuator block is configured to be removeably fitted into a mounting surface 64, e.g. a flat or curved metal or plastic plate. In some implementations, as shown in FIGS. 6a and 6b, the active tuned resonant circuit 10 of the actuator motion sensor may be separate from actuator block: There is no direct electrical connection necessary between the active tuned resonant circuit and the actuator block, and thence to the drive electronics and to the read-out electronics connected to the active tuned resonant circuit. Such an arrangement, by means of a clip or other retention device 66 (or simply by means of a push-fit), allows the actuator block to be removed from the mounting surface 64 of a keyboard and to be replaced by a substantially similar actuator block but potentially with different mechanical characteristics e.g. a different strength of spring. Thus in implementations it is possible, without compromising the integrity of electrical connections, to interchange actuator blocks with differing characteristics including, but not limited to: resisting force of the biasing element 16; distance of travel of the actuator 15; tactile response of the actuator block; deformability of the deformable endstop 68; acoustic sound when the deformable endstop 68 contacts lower housing 62.

Figure 6C:
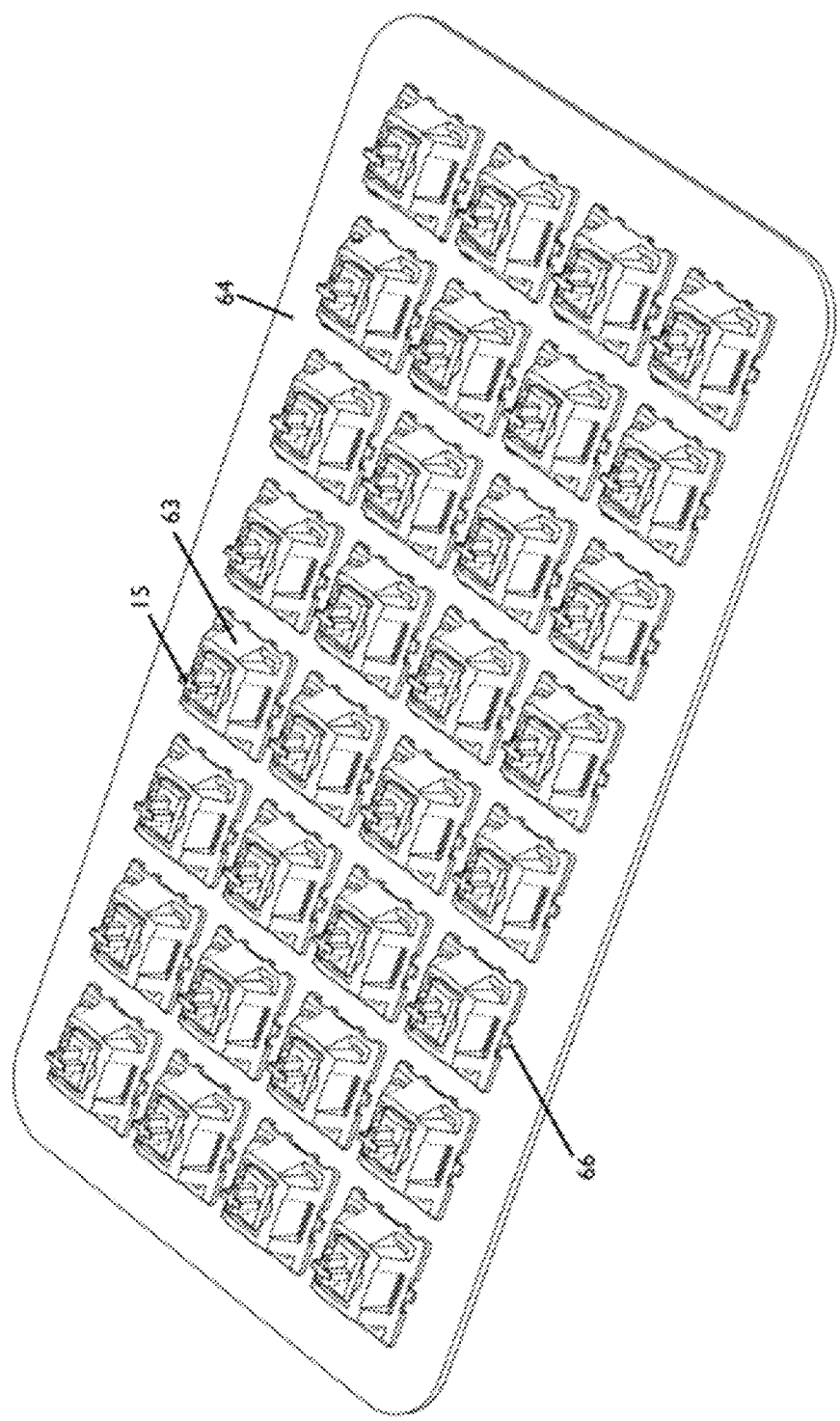

FIG. 6c shows an example of a keyboard comprising key assemblies of the type shown in FIGS. 6a and 6b.

Figure 6D:
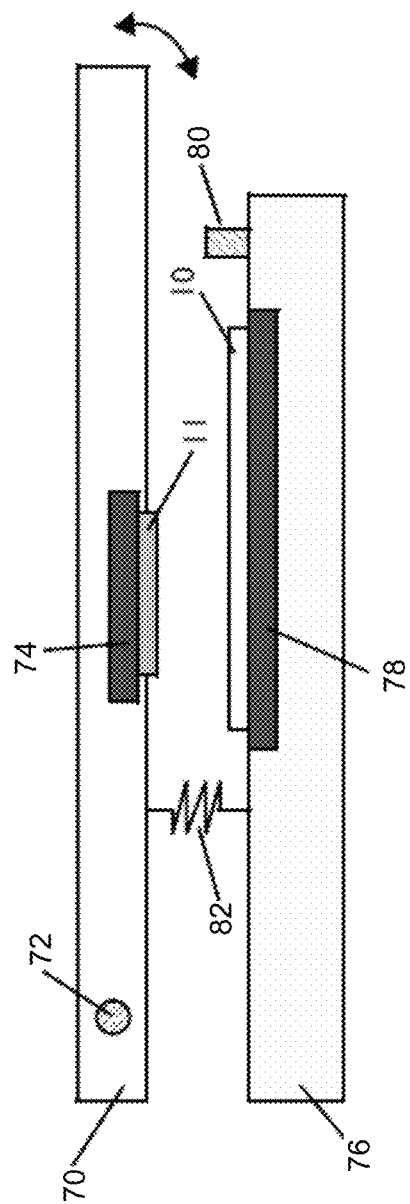

FIG. 6d shows an example of a key assembly which may be used for the hinged key of a computer, e.g. laptop keyboard. A key comprises a hinged actuator 70 bearing the passive tuned resonant circuit 11. The hinged actuator 70 may but need not carry a separate key top, and may be hinged at a pivot 72; where the hinged actuator 70 is electrically conductive the passive tuned resonant circuit 11 may be mounted on a non-conductive air gap or spacer 74. A backplane 76, may carry the active tuned resonant circuit 10, again with an optional air gap or spacer 78. The hinged actuator 70 may be provided with a deformable end stop 80, e.g. mounted on the backplane. A biasing element 82 such as a spring biases the hinged actuator to separate the passive and active resonant circuits.

In one example a hinged key for a laptop keyboard comprises a moveable top member that is rotated about a pivot point and which resists movement by means of a spring or other mechanical linkage; a fixed bottom member; an optional deformable end-stop which limits movement of said top member; and a position sensor comprising an active tuned resonant circuit inductively coupled to an electrically reactive element, henceforth referred to as the target, providing a signal which varies as the mutual separation of said active tuned resonant circuit and said target is varied, drive electronics connected to the active tuned resonant circuit and read-out electronics connected to the active tuned resonant circuit.

In another implementation, which may be combined with those described previously, alternate keys of a keyboard i.e. alternate actuator motion sensors, may be configured to be driven with different frequencies, e.g. operated at respective first and second resonant frequencies F1 and F2. Amongst a subset of keys i.e. actuator motion sensors, in each time slot only one actuator motion sensor operating at a first frequency of resonance may be enabled and only one actuator motion sensor operating at a second frequency of resonance may be enabled. Furthermore, in implementations physically adjacent actuator motion sensors are never enabled at the same time, minimising the interference components. A plurality of the subsets of actuator motion sensors may be operated simultaneously.

Figure 7:
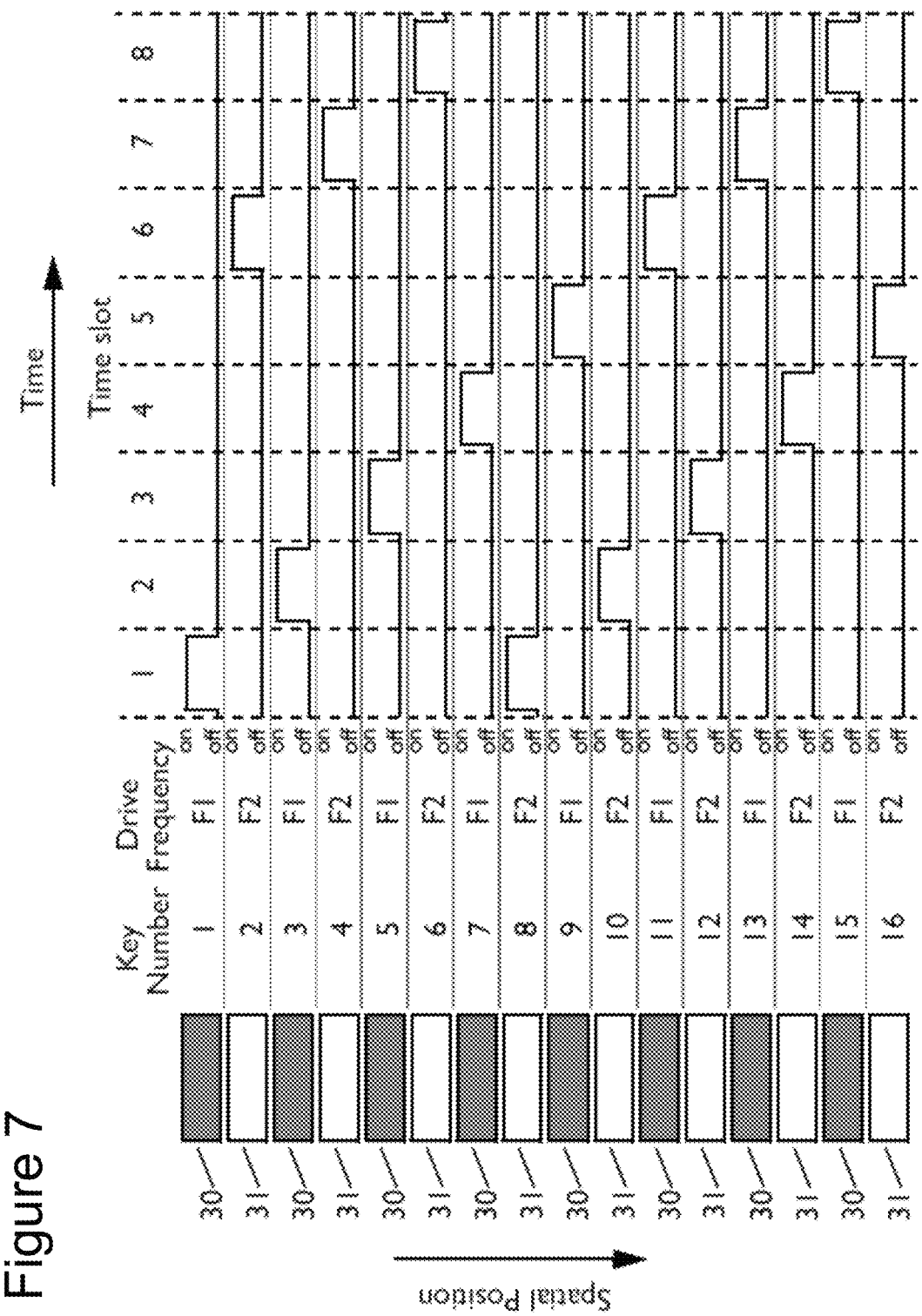
FIG. 7 shows a timing diagram of a time division multiplex circuit used to multiplex a plurality of active tuned resonant circuits for a computer keyboard.

An example multiplexing scheme is shown in FIG. 7. The actuator motion sensors of the sensing system may be divided up into spatial groups e.g. each comprising keys which are not directly adjacent to one another, illustrated by the black and white bars in FIG. 7. The sensors in one group of keys may have a different resonant frequency to the sensors in another group of keys. In an example, in a group, illustrated say by the black bars, there are 8 time slots and every $8^{th}$ key is activated (driven) simultaneously. This approach may be adapted for k time slots, driving every kth key simultaneously (that is simultaneously driven keys have k−1 inactive keys between them). Keys in simultaneously active groups, e.g. illustrated by the black and white bars, may be (physically) separated as far as possible.

For example in implementations a multiplexing system is provided to multiplex the RF drive signal such that simultaneously driven key sensors are separated or surrounded by at least (k−1) keys, where (k−1) is an integer equal to or greater than 1, at least one detector detecting the level of RF signal from a driven actuator motion sensor.

Some implementations of the system do not employ different groups of keys with different resonant frequencies. Instead all the sensors may have substantially the same resonant frequency. Use of such an approach is facilitated by the coil design with opposite senses of winding described previously. Thus there may be k time slots and every kth key may be active (driven) simultaneously.

Figure 8:
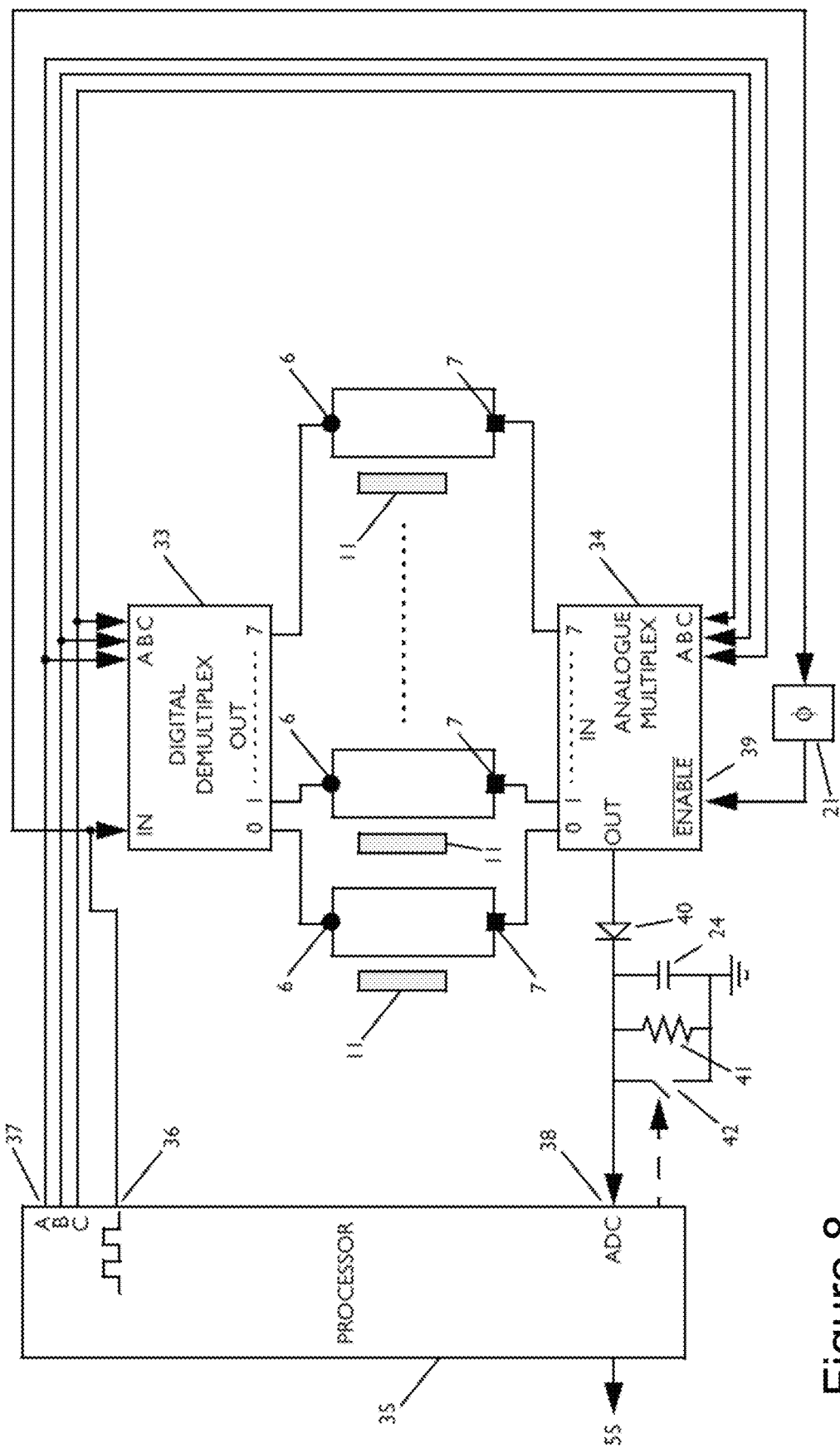
FIG. 8 shows a circuit diagram of a time division multiplex system to multiplex a plurality of active tuned resonant circuits to determine the position of a plurality of actuators on a keyboard.

FIG. 8 shows an example time-division multiplexed controller, configured to drive a set or subset of actuator motion sensors operating at a single frequency of resonance. In the system of FIG. 8 a processor 35 generates a drive waveform 36 whose frequency matches the frequency of resonance the actuator motion sensors' active tuned resonant circuits; the processor generates selector signals 37 to select which actuator motion sensor is to be enabled; the actuator motion sensors' outputs 7 are coupled to an analogue multiplexer 34; the analogue multiplexer's output is coupled to an analogue-to-digital converter within the processor via a low-pass filter comprising a capacitive element 24 and resistive element within the analogue multiplexer; and an output 55 from the processor used to send information regarding the position and velocity of the actuator motion sensors. A further advantage to using the analogue multiplexer to couple the actuator motion sensors' outputs to the analogue-to-digital converter is that the analogue multiplexer can perform the function of the analogue switch 22 used for synchronous demodulation whereby the output of the analogue multiplexer can be synchronously enabled and disabled via an enable input 39 coupled to the drive waveform 36. In the case where a plurality of actuator motion sensors are operated at substantially different frequencies of resonance the time-division multiplexed scheme can be replicated as necessary. A suitable processor is an ARM Cortex-M0.

FIG. 8 shows just one demultiplexer/multiplexer but if there are multiple resonant frequencies one demultiplexer/multiplexer may be employed for each of the resonant frequencies used. For example a second demultiplexer/multiplexer may be used where alternate resonant frequencies are mapped to alternate keys of the keyboard.

Decreased sensitivity to detuning of the actuator motion sensor's active tuned resonant circuit or passive tuned resonant circuit, for example, caused by variations of component tolerance, may be facilitated by coupling the output of the (optional) synchronous demodulator circuit to a peak detection circuit comprising a diode 40 a capacitive element 24 and optionally a resistive element 41 or a switching element 42 (to reset the charge on capacitive element 24). In the case where a switching element is used the switching element may reset the detected peak level synchronously with the selector signals used to control the multiplexers.

The signal from the detector (read-out circuitry) may be input to an analogue-to-digital converter 38, for example integrated into an analogue input of processor 35.

In the case where a disabled actuator motion sensor's active tuned resonant circuit is not being driven, the active tuned resonant circuit acts as a tuned antenna. This can have a negative effect whereby moving the target corresponding to the disabled actuator motion sensor can produce a measurable variation in the output of a similarly-tuned actuator motion sensor. This is even if the similarly-tuned actuator motion sensor is not physically adjacent to the disabled actuator motion sensor and the motion of the target is constrained to be within its normal limits above the disabled actuator motion sensor. This negative effect can be reduced by changing the frequency of resonance of the disabled actuator motion sensor's active tuned resonant circuit for the duration of the disablement, for example by changing the capacitance, resistance or inductance of the active tuned resonant circuit by electronic switching. This can be done by driving the disabled sensor with a direct-current, or low-frequency signal, to prevent resonance. Referring to FIG. 8, a way to achieve this in a time-division multiplexed scheme is to use a digital demultiplexer 33 to drive the inputs 6 of the active tuned resonant circuits. Enabled actuator motion sensors' active tuned resonant circuits are driven by a waveform 36 at the frequency of resonance of the active tuned resonant circuits and disabled actuator motion sensors' active tuned resonant circuits are driven by a direct-current signal corresponding to logic-high or logic-low of the digital demultiplexer.

It is important for the performance of a keyboard to be stable over a range of operating temperatures. Although the tuned resonant circuits used by a actuator motion sensor as described herein have excellent temperature stability, particularly when the tuned resonant circuits are formed on a printed circuit board and the capacitive elements of the tuned resonant circuits comprise temperature-stable dielectrics (Class 1 dielectrics), other electronic elements in the circuit can have properties that change with temperature which may cause a variation in the output signal of the actuator motion sensor with variations in operating temperature. Such electronic elements include but are not limited to: diode 40, digital demultiplexer 33, analogue multiplexer 34, resistive elements 4, 5 and 41, tracks on printed circuit boards, and voltage regulators. Therefore a temperature compensation scheme can be useful to minimise variations in the output signals of a plurality of actuator motion sensors on a keyboard caused by variations in operating temperature.

An example temperature compensation scheme comprises: performing measurements of the output signal of a actuator motion sensor while driving the actuator motion sensor's active tuned resonant circuit with a direct-current, or low-frequency signal such that the actuator motion sensor's passive tuned resonant circuit has no effect on the output signal of the actuator motion sensor; the first of the measurements is performed during a calibration procedure; the subsequent the measurements are performed periodically, typically within additional time slots of a time-division multiplexed scheme; calculating temperature-dependent offsets in the output signal by subtracting subsequent the measurements from the first measurement; and adding the offsets to the measurement of the output signal when the active tuned resonant circuit is being driven at a frequency equal to or close to the frequency of resonance of the active tuned resonant circuit to measure position. Such a temperature compensation scheme may utilise one temperature-dependent offset for: each actuator motion sensor in a keyboard; each group of actuator motion sensors in a keyboard; or for all actuator motion sensors in a keyboard.

A keyboard with moveable keys utilising a multiplexing scheme as hereinabove described allows fast and accurate measurement of the position of the keys. For example it is possible to multiplex the example shown in FIG. 8 wherein the frequency of update of selector signals 37 is at least 32,000 Hz thus allowing the position of each moveable key in a subset of 8 moveable keys to be determined at a frequency of 4,000 Hz. This example can be replicated and run in parallel for other subsets of moveable keys, thus allowing e.g. a keyboard with 101 or 104 keys to have the position of the keys determined at a rate of at least 404,000 or 416,000 keys/second. Positions of the keys should ideally be determined at least 250 times per second, corresponding to a rate of at least around 26,000 keys/second for e.g. 101 or 104 keys, to allow suitably accurate timing of key/button-on events and key/button-off events and optionally to determine the actuator velocity associated with the events. Implementations of the described system easily exceed these targets.

Figure 9:
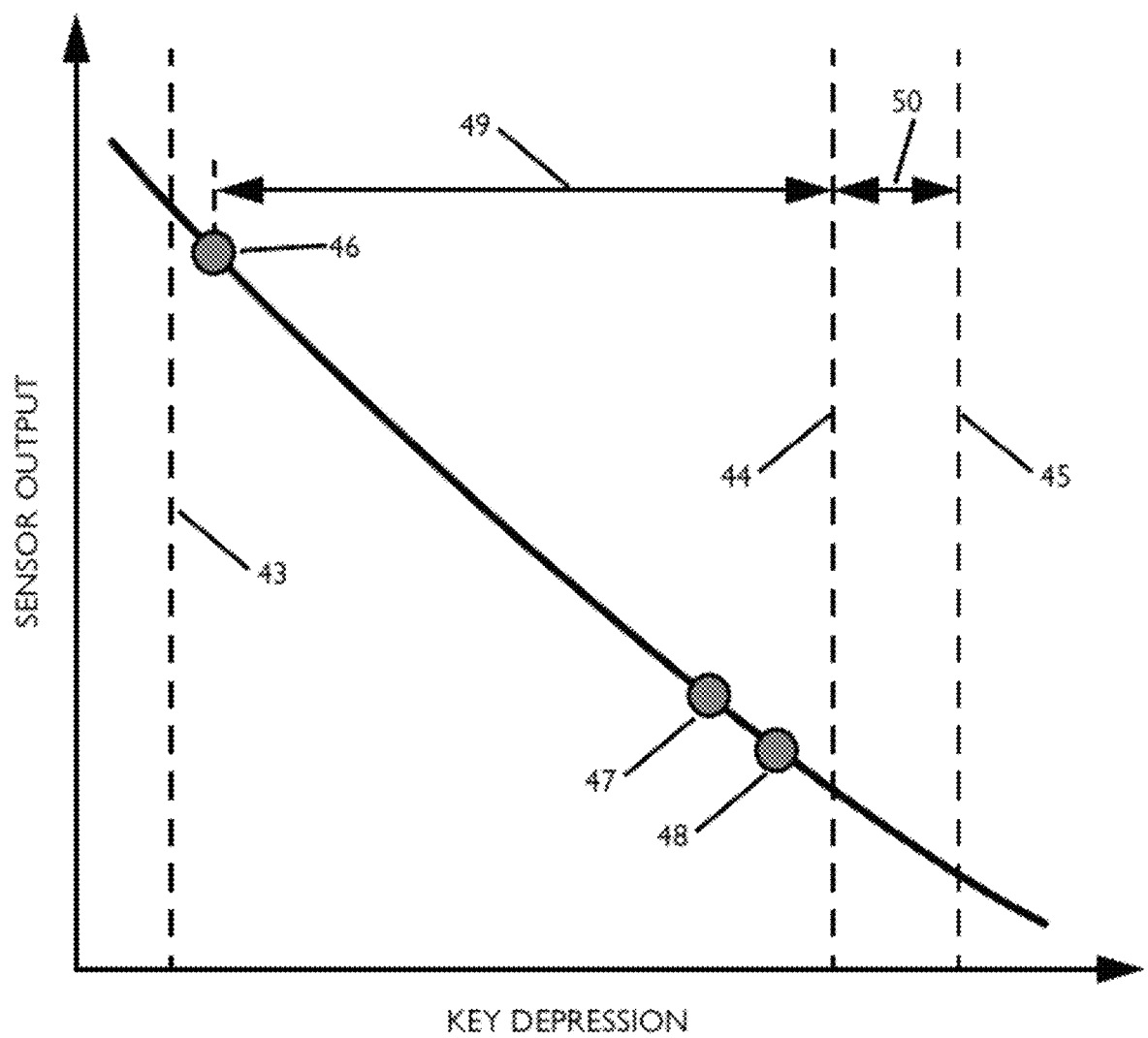
FIG. 9 shows a plot of an output of an actuator motion sensor versus key displacement for an actuator of a keyboard.
Figure 11:
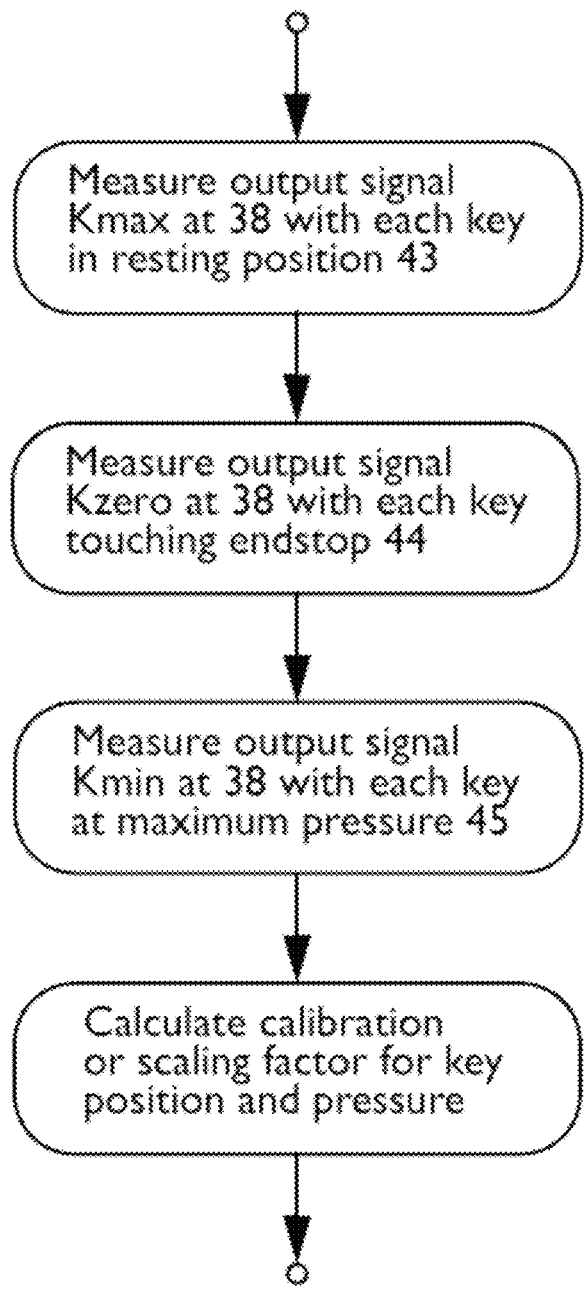
FIG. 11 shows an example calibration procedure for calibrating the detected position of an actuator key on a keyboard.

Referring to FIG. 9, when a moveable key on a keyboard according to example implementations of the system is depressed there are three primary positions of the key: a resting position Kmax 43 when the key is at rest; a point Kzero 44 when a moveable top member of the key/actuator makes a first contact with the deformable end-stop; and a point of maximum depression Kmin 45, corresponding to the point of maximum pressure being applied to the key by a typical user, at which the deformable end-stop may be considered to be maximally deformed. For a plurality of such moveable keys, due to mechanical variation and due to electronic component tolerance, it is unlikely that the output signal of the actuator motion sensor of a first key at any one of the primary positions of the first key will be identical to the output signal of the actuator motion sensor of a second key at the same primary position of the second key. Therefore a calibration procedure is desirable to ensure that the position of any moveable keys is known relative to the respective primary positions of the moveable keys. Such a calibration procedure is shown in FIG. 11.

In the case where the position of a moveable key is between primary positions Kmax and Kzero, the calibrated position K of the key as a percentage of depression between Kmax and Kzero can thus be calculated from the measured position Ko of the key using the following equation: K=100%×(Ko−Kzero)/(Kmax−Kzero).

In the case where the position of a moveable key is between primary positions Kzero and Kmin, the calibrated position Kpress of the key as a percentage of depression between Kzero and Kmin, 50 in FIG. 9, can thus be calculated from the measured position of the key Ko using the following equation: Kpress=100%×(Ko−Kmin)/(Kzero−Kmin). In such a case Kpress may be considered to be the amount of pressure being applied to the key, corresponding to the range of depression 50 of the key.

In some embodiments the calculation of Kpress may include an offset, Kpoff, whereby Kpress is zero until the position of the key Ko lies between (Kzero−Kpoff) and Kmin; thence Kpress=100%×(Ko−Kmin)/(Kzero−Kpoff−Kmin). The offset creates a dead-zone wherein variation in position of the key results in no variation of calibrated position K of the key and in no variation of Kpress. This facilitates implementation of an aftertouch threshold.

On a typical keyboard it is desirable for each moveable key on the keyboard to issue a key-pressed event when the depression of the key is beyond a secondary position Kon and to issue a key-released event when the depression of the key is returned to another secondary position Koff. In some cases Kon may equal Koff, but it is preferred for Kon and Koff to be unequal. Referring to FIG. 9, preferably secondary position Kon 48 is chosen to be near the primary position Kzero 44. Similarly, the secondary position Koff 47 is chosen to be near the secondary position Kon.

In some embodiments the secondary position Koff 46 of each moveable key is chosen to be near the primary position Kmax 43. Such an arrangement allows the position of the key to be used to issue expression events prior to issuing a key-released event wherein the measured position Ko of the key between Koff and Kzero can be used to calculate a calibrated expression value Kexp=100%×(Ko−Kzero)/(Koff−Kzero), corresponding to the range of depression 49 of the key.

Figure 12:
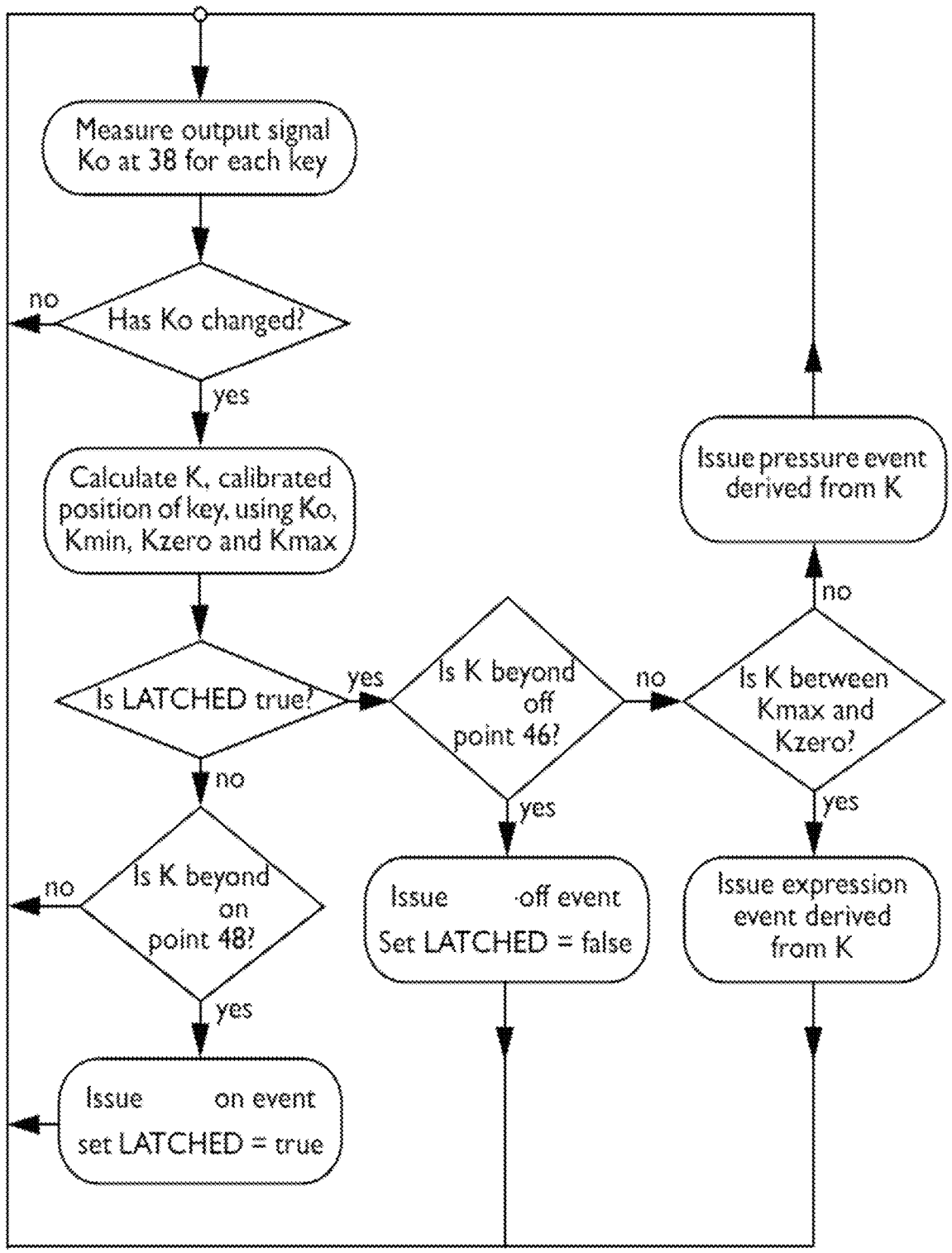
FIG. 12 shows an example process used to detect key-on events, key-off events, expression events, and pressure events for an actuator of a keyboard.

The example process of FIG. 12 may be used for each moveable key on a keyboard in an implementation of the system wherein the measured position Ko of the moveable key, when calibrated using primary positions Kmax, Kzero and Kmin and thence using secondary positions Kon and Koff, may be used to issue: key-pressed events, key-released events, expression events and pressure events for each moveable key on the keyboard.

A particular advantage of deriving the secondary positions Kon and Koff of a moveable key on a keyboard from the primary positions Kmax and Kzero of the moveable key is that the secondary positions can be modified easily by simple numerical calculations, allowing the response of the keyboard to be changed. Moreover such a modification can be different for each individual key on a keyboard with a plurality of moveable keys, allowing a large range of responses to be achieved on the keyboard without requiring any mechanical changes to the keyboard.

To provide further control of a computer system it is possible to send velocity information relating to key-pressed events and optionally also information related to key-released events. Such velocity information can be determined by measuring the separation in time between two known points of key depression, or conversely measuring the change in the key depression at two known points in time.

In implementations the velocity (speed and direction) of a moveable key is determined from a plurality of positions of the key at a plurality of corresponding times using averaging, filtering, or similar methods. An example is described in detail below. Such a method of calculating the velocity has several advantages over other methods: it does not assume a linear velocity profile as is used for a two-point measurement method but allows changes in velocity throughout the range of depression of the key to be detected thus measured values of velocity are more representative of the true velocity of the key thus making the response of the key more consistent; higher resolution and precision of velocity can be determined because a larger number of statistically significant data points are used; and it allows predictions of the future position of the key to be calculated allowing, for example, the future time at which the key's position equals secondary positions Kon and Koff to be estimated, thus permitting key-pressed or key-released events to be issued in advance of the corresponding physical event thus compensating for latency in a computer system.

One example filtering procedure is as follows:

$$deltaV = deltaPos \text{(i.e. the change in position between fixed time steps)}$$

$$alpha = k*abs(deltaV)$$

The filtering coefficient, alpha, depends on magnitude of deltaV; alpha is limited to sensible values to avoid overflow/underflow.

$$velocity = alpha*last\_velocity + deltaV*(1-alpha)$$

Such a method, which may be implemented in the digital domain, can provide improved resolution because of the filtering, which is especially important for a very slowly moving key, without significantly compromising the time response for a fast-moving key. Modifying the filtering and/or a maximum permitted velocity value can be used, for example, to give it a harder of softer response.

Figure 10:
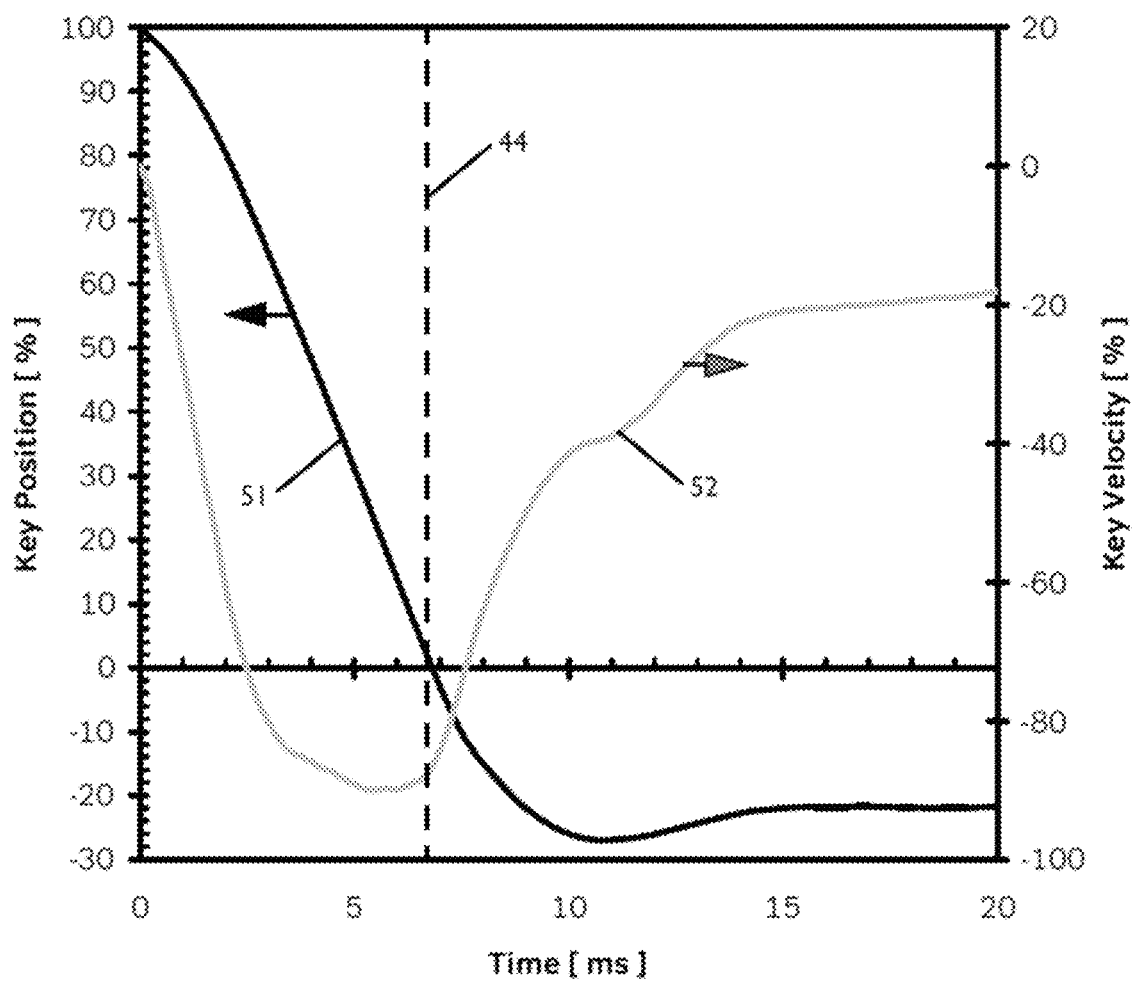
FIG. 10 shows an example of measured position and measured velocity of an actuator on a keyboard as it is depressed.

To illustrate such benefits of such a method, FIG. 10 shows the calibrated position 51 of a moveable key and the corresponding calibrated velocity 52 of the key wherein the depression of the key reaches primary point Kzero 44 within 7 ms of the start of depression of the key. The plot of FIG. 10 approximates a velocity calculated directly from differentiated position but when the position moves slowly the velocity filtering is heavier so the velocity lags a little. Such a method can yield substantially more information regarding the velocity of a moveable key on a keyboard than other methods.

Movement detection systems for computer keyboards have been described as well as sensing systems and methods for keyboard input devices. However the techniques described are not limited to desktop computer keyboards and may also be used, for example for laptop keyboards, keyboards for industrial or scientific equipment, game controllers and computer mouse buttons.

For example in some implementations the above described techniques may be employed in a laptop keyboard. In this case one or both of the passive and active resonant circuits may be mounted on a flexible PCB. For example the passive resonant circuits may be mounted beneath the keys, on a flexible PCB and the active resonant circuits may be mounted on an underlying rigid PCB. The ability to sense position may be used to sense pressure applied to a key, for example if some resilient material is provided between the active and passive resonant circuits. In some implementations, for example a laptop, computer, or other keyboard, where the keys are arranged in a 2D pattern on a flat or curved surface, the multiplexing may be arranged, for example in a generally corresponding manner to that described above, so that no key is driven at the same time as an adjacent key in two dimensions. For example in a rectangular 2D grid alternate keys in each of two dimensions in a surface defined by the keyboard may be active in alternate time slots (i.e. two sets of non-adjacent keys may be identified); this may be extended to key layouts defined by hexagonal and other grids where sets of non-adjacent keys may similarly be identified. Keys which are adjacent to one another in a surface defined by the keyboard may be inactive and/or damped when a target key is read. However, as previously described, the multiplexing may be arranged to read multiple keys of the keyboard simultaneously. The described techniques can be advantageous for computer and other keyboards because they can be fabricated inexpensively and because response times can be very quick, for example <1 ms.

Figure 13:
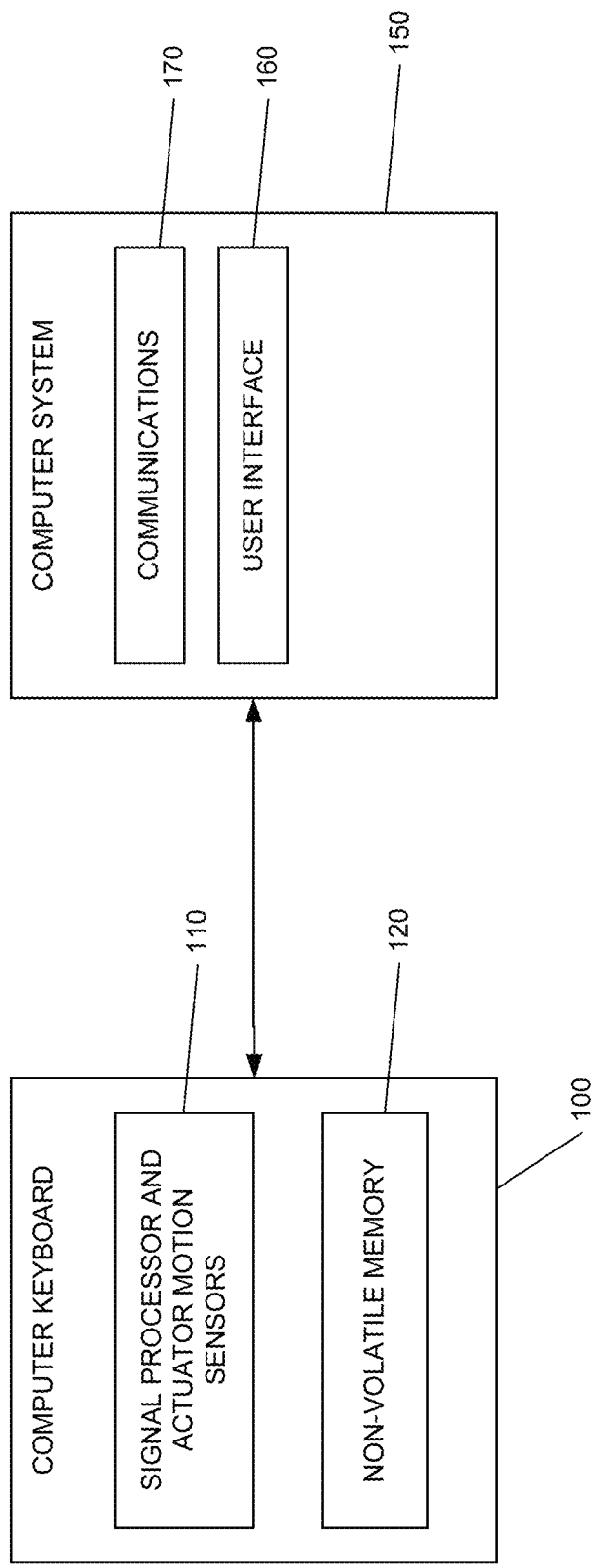
FIG. 13 shows a block diagram of an example implementation of a sensing system for a computer input device.

FIG. 13 shows an example of a computer keyboard 100 incorporating a sensing system 110 including a signal processor and actuator motion sensors as previously described. The computer keyboard also includes non-volatile memory 120 for storing configuration data defining characteristics e.g. the sensitivity of the actuator motion sensors, individually or in groups. The non-volatile memory may be incorporated into the sensing system 110.

The computer keyboard 100 is coupled by a wired or wireless connection to a computer 150. This provides a user interface 160 to enable user-definition of the configuration data, and a communications interface 170, to enable import and/or export of the configuration data. Thus the computer keyboard may be electronically configurable as well as or instead of being mechanically configurable.

Further aspects of the invention are set out in the following clauses:

1. A sensing system for a computer keyboard. The sensing system may comprise a plurality of key sensors. Each key sensor may comprise a passive resonant circuit, for example for mounting on a moving part of a key, and an active resonant circuit, for example for mounting in a reference position. In implementations the passive resonant circuit has a resonant frequency and the active resonant circuit is configured to excite the passive resonant circuit at the resonant frequency. The sensing system may further comprise at least one sensor driver to drive the active resonant circuit with an RF drive signal at the resonant frequency; this may be shared between multiple sensors. In implementations the sensing system may further comprise a multiplexing system, such as one or more multiplexers and/or demultiplexers, to multiplex the drive signal such that simultaneously driven key sensors are (physically) separated by at least (k−1) keys, where (k−1) is an integer equal to or greater than 1. Thus in implementations one key is not driven at the same time as an adjacent key (or at the same time as a key at least k keys away). The sensing system may further comprise at least one detector, for example readout-circuitry and/or a microprocessor, to detect a level of RF signal from a driven key sensor. This may be used for sensing a position and/or velocity of a key associated with the key sensor. The at least one detector may detect variation of a resonant RF signal in the active resonant circuit with relative position of the active and passive resonant circuits; it may peak-detect the level of RF signal.

2. A sensing system as defined in clause 1 configured to damp the active resonant circuits of key sensors which are not driven.

3. A sensing system as defined in clause 1 or 2 wherein at least the active resonant circuit comprises one or more coils with windings in opposite senses, in particular wherein the windings in opposite senses are configured to generate magnetic fields in opposite senses to cancel one another.

4. A sensing system as defined in clause 1, 2 or 3 wherein the active resonant circuit comprises a pair of laterally adjacent pancake coils.

5. A sensing system as defined in any one of clauses 1 to 4 further comprising a temperature-compensation system to temperature-compensate the detected level of RF signal, wherein the temperature-compensation system is configured to apply an off-resonance drive signal to at least one of the active resonant circuits, to measure a level of the off-resonance drive signal from the at least one detector, and to compensate the detected level of RF signal responsive to the level of the off-resonance drive signal.

6. A sensing system as defined in clause 5 wherein the multiplexing system is configured to multiplex the drive signal such that one of the key sensors is driven in each of a set of time slots, and wherein the temperature-compensation system is configured to apply the off-resonance drive signal during an additional time slot to the set of time slots.

7. A sensing system as defined in any one of clauses 1 to 6 wherein each key sensor further comprises a deformable element to limit motion of one or both of the passive resonant circuit and the active resonant circuit for pressure sensing.

8. A set of sensors for a computer keyboard. The keyboard has a plurality of keys. The set of sensors may be part of a sensing system. Each sensor may comprise a passive resonant circuit for mounting on a moving part of a key and an active resonant circuit for mounting in a fixed, reference position, for example on part of the keyboard. In implementations the passive resonant circuit has a resonant frequency and the active resonant circuit excites the passive resonant circuit at the resonant frequency. Each sensor may further comprise a detector, which may be shared between multiple sensors, to detect variation of a resonant signal in the active resonant circuit with relative position of the active and passive resonant circuits to thereby detect a position and/or velocity of the key. The variation may, in some implementations, be a variation in amplitude of signal in the resonant signal. The set of sensors may comprise sensors having two or more different resonant frequencies arranged such that sensors having the same resonant frequency are non-adjacent when mounted to sense keys of the computer keyboard.

9. A sensing system as defined in clause 8 wherein sensors having a first resonant frequency are interleaved with sensors having a second, different resonant frequency.

10. A sensing system as defined in clause 8 or 9 further comprising a multiplexing system and/or controller to control selection of sensors of the set of sensors such that adjacent keyboard sensors are selected at different times.

11. A sensing system as defined in any one of clauses 1-7 and 10 wherein the multiplexing system/controller is further configured to damp the active resonant circuits of unselected sensors.

12. A sensing system as defined in clause 10 or 11 wherein the multiplexing system/controller is configured to time division multiplex operation of the sensors, wherein each resonant frequency defines a group of sensors having the resonant frequency, wherein the time division multiplexing defines a plurality of n time slots, and wherein successive keyboard sensors of each group are allocated successive time slots.

13. A sensing system as defined in clause 12 wherein there are N resonant frequencies and N groups of sensors, wherein sensors of the groups of sensors are interleaved on the keyboard.

14. A sensing system as defined in clause 13 wherein the multiplexing system/controller is configured such that keyboard sensors in the same group and activated in the same time slot have (n×N)−1 sensors between them.

15. A sensing system as defined in any preceding clause further comprising a processor configured to process the variation of the resonant signal in the active resonant circuit of each sensor to determine the motion of each key of the keyboard over a succession of time intervals as a depressed key moves between released and depressed positions, in particular wherein the motion of each key comprises a position and a velocity of the key as the key moves between released and depressed positions.

16. A sensing system as defined in clause 15 wherein the processor is configured to process the variation of the resonant signal in the active resonant circuit of each sensor to determine the velocity of a key, as the key moves between depressed and released positions, from changes in position of the key determined at successive time intervals filtered dependent upon key velocity.

17. A sensing system as defined in any preceding clause further comprising a processor coupled to process the level/variation of the RF/resonant signal to determine a key press and key release event for each key.

18. A sensing system as defined in any one of clauses 15-17 wherein the processor is further configured to distinguish between at least three different key positions, a first, note-off position, a second, note-on position, and a third, aftertouch position, wherein the aftertouch position is beyond the note-on position and corresponds to additional pressure applied to the key after depression.

19. A sensing system as defined in any preceding clause further comprising a substrate supporting the active resonant circuits for the sensors in a sequence corresponding to a sequence of keys of the keyboard.

20. A computer keyboard comprising the sensing system of any preceding clause.

21. A polyphonic aftertouch keyboard comprising the sensing system or keyboard of clause 19 or 20, each key having a deformable end-stop, such that the after-touch position corresponds to movement of a key beyond an end-stop position defined by the deformable end-stop, wherein identification of the aftertouch position for the key enables aftertouch.

22. A method of sensing the positions of a plurality of keys, for example of a computer keyboard. The method may comprise providing each key with a sensor comprising a passive resonant circuit for mounting, for example, on a moving part of a key and an active resonant circuit for mounting, for example, in a fixed, reference position, for example part of the computer keyboard. In some implementations the passive resonant circuit has a resonant frequency, the active resonant circuit exciting the passive resonant circuit at the resonant frequency. Each sensor may further have a detector, which may be shared, to detect variation of a resonant signal in the active resonant circuit with relative position of the active and passive resonant circuits to detect a position and/or velocity of the key. The method may further comprise arranging the sensors to operate at two or more different resonant frequencies arranged such that keyboard sensors having the same resonant frequency are non-adjacent. Additionally or alternatively and/or the method may further comprise reducing interference between sensors by configuring one or more coils of at least the active resonant circuits, and optionally also of the passive resonant circuits, to have windings in opposite senses.

23. A method as defined in clause 22 further comprising providing aftertouch by distinguishing between at least three different key positions, a first, note-off position, a second, note-on position, and a third, aftertouch position, wherein the aftertouch position is beyond the note-on position and corresponds to additional pressure applied to the key after depression and movement of a key beyond an end-stop position.

24. A method of periodically compensating a response of a computer keyboard. Each key of the keyboard may have a sensor comprising an active resonant circuit, a passive tuned resonant circuit and a detector. The method may comprise retrieving from storage a detected initial output signal of the sensor, $O_{r0}$, at a first time, $t_0$, wherein at $t_0$ the active resonant circuit is being driven at a frequency below a resonant frequency of the active resonant circuit. The method may further comprise, periodically, for at least one of the sensors, detecting a later output signal of the sensor, $O_{r1}$, at a time after $t_0$. The method may then calculate an adjustment value, for example a difference between the initial output signal of the sensor and the later output signal of the sensor. The method may then further comprise compensating the response of the keyboard by adjusting an operational output of the sensor using the adjustment value. The operational output may be an output from the sensor when the active resonant circuit is being driven at the resonant frequency of the active resonant circuit. The method may further comprise operating the sensor according to a time division multiplexed addressing scheme. The method may then using a "spare" time slot of the time division multiplexed addressing scheme, in which the sensor is not operational, for the detecting.

25. The method of clause 24 further comprising operating the sensor according to a time division multiplexed addressing scheme, and using a time slot of the time division multiplexed addressing scheme in which the sensor is not operational for the detecting.

26. A set of sensors for a computer keyboard. The keyboard has a plurality of keys. The set of sensors may be part of a sensing system. Each sensor may comprise a passive resonant circuit for mounting on a moving part of a key and an active resonant circuit for mounting in a fixed, reference position, for example on part of the computer keyboard. In implementations the passive resonant circuit has a resonant frequency and the active resonant circuit excites the passive resonant circuit at the resonant frequency. Each sensor may further comprise a detector, which may be shared between multiple sensors, to detect variation of a resonant signal in the active resonant circuit with relative position of the active and passive resonant circuits to thereby detect a position and/or velocity of the key. The variation may, in some implementations, be a variation in amplitude of signal in the resonant signal. The set of sensors may comprise sensors having two or more different resonant frequencies arranged such that sensors having the same resonant frequency are non-adjacent when mounted to sense keys of the keyboard.

The above described techniques may be employed in a laptop keyboard. In this case one or both of the passive and active resonant circuits may be mounted on a flexible PCB. For example the passive resonant circuits may be mounted beneath the keys, on a flexible PCB and the active resonant circuits may be mounted on an underlying rigid PCB. The ability to sense position may be used to sense pressure applied to a key, for example if some resilient material is provided between the active and passive resonant circuits. In some implementations, for example a laptop, computer, or other keyboard, where the keys are arranged in a 2D pattern on a flat or curved surface, the multiplexing may be arranged, for example in a generally corresponding manner to that described above, so that no key is driven at the same time as an adjacent key in two dimensions. For example in a rectangular 2D grid alternate keys in each of two dimensions in a surface defined by the keyboard may be active in alternate time slots (i.e. two sets of non-adjacent keys may be identified); this may be extended to key layouts defined by hexagonal and other grids where sets of non-adjacent keys may similarly be identified. Keys which are adjacent to one another in a surface defined by the keyboard may be inactive and/or damped when a target key is read. However, as previously described, the multiplexing may be arranged to read multiple keys of the keyboard simultaneously.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:
1. A sensing system for a computer input device, wherein the computer input device is a computer keyboard or mouse or joystick or game controller, the sensing system comprising:
  an actuator, wherein the actuator is configured to attach to or comprises or consists of a key top or button;

an actuator motion sensor associated with the actuator to detect motion of the actuator, the actuator motion sensor comprising:
a passive resonant circuit configured to be moved by the actuator and having a resonant frequency;
an active resonant circuit configured to excite the passive resonant circuit at the resonant frequency;
a biasing element configured to exert a biasing force on the actuator, wherein either:
the actuator is movable along an axis and the biasing element is configured to exert the biasing force along the axis; or
wherein the actuator is a hinged actuator and the biasing element is configured to exert the biasing force on the actuator directed to bias the passive resonant circuit of the actuator away from the active resonant circuit;
at least one sensor driver to drive the active resonant circuit with an RF drive signal at the resonant frequency; and
at least one detector to detect a level of RF signal from a driven actuator motion sensor for sensing at least one of a position and a velocity of the actuator associated with the actuator motion sensor.

2. A sensing system for a computer keyboard, the sensing system comprising:
a plurality of key sensors, wherein each of the plurality of key sensors comprises:
a passive resonant circuit, and an active resonant circuit, the passive resonant circuit having a resonant frequency, the active resonant circuit being configured to excite the passive resonant circuit at the resonant frequency, and optionally an actuator;
the sensing system further comprising:
at least one sensor driver to drive the active resonant circuits with an RF drive signal at the resonant frequency;
a multiplexing system; and
at least one detector to detect a level of RF signal from a driven key sensor for sensing at least one of a position and a velocity of a key associated with the key sensor;
wherein the multiplexing system is configured such that no key is driven at the same time as an adjacent key in each of two dimensions.

3. The sensing system of claim 1, further comprising a casing for the actuator, the biasing element, and the passive resonant circuit, wherein the casing with the actuator, the biasing element, and the passive resonant circuit defines an actuator block.

4. The sensing system of claim 3, further comprising the computer input device, wherein the computer input device comprises a mounting surface for the actuator block, wherein the actuator block is configured to be removably fitted into the mounting surface such that one actuator block is exchangeable for another, and wherein when the actuator block is fitted into the mounting surface the passive resonant circuit is in operable proximity to the active resonant circuit.

5. The sensing system of claim 4 wherein the casing further comprises a catch having a catching position and a releasing position, wherein the catch is configured to attach the casing of the actuator block to the mounting surface when the catch is in the catching position and is operable to release the actuator block from the mounting surface.

6. The sensing system of claim 4, comprising a set of the actuator blocks, wherein the actuator blocks have different mechanical responses to one another, wherein the mechanical response of an actuator block defines a force needed to define the at least one of the sensed position and velocity.

7. The sensing system of claim 6 wherein the computer input device is an alphanumeric keyboard and wherein the set of the actuator blocks are for keys of the alphanumeric keyboard.

8. The sensing system of claim 1, wherein the actuator has a start position, when the actuator is in a quiescent state, and a depressed position, the sensing system further comprising a signal processor configured to process the detected level of RF signal to sense at least one of a position and a velocity of the actuator between the start position and the end position for determining a key or button response associated with said actuator motion sensor.

9. The sensing system of claim 8, further comprising a deformable end stop for the actuator, wherein the depressed position is defined by the deformable end stop, and wherein signal processor is configured to process the detected level of RF signal to sense when force is applied to the actuator to move the actuator beyond the deformable end stop, and to provide an aftertouch signal.

10. The sensing system of claim 1, wherein the sensing system comprises a plurality of actuator motion sensors positioned in an array, the sensing system further comprising a multiplexing system to multiplex the RF drive signals for the actuator motion sensors such that simultaneously driven actuator motion sensors are separated by at least one actuator motion sensor in at least one of two orthogonal directions.

11. The sensing system of claim 1, further comprising:
a backplane, wherein the backplane bears a plurality of the active resonant circuits each comprising a respective coil with one or more windings, each for a respective actuator motion sensor; and
a signal processor configured to process the detected level of RF signal to sense at least one of a position and a velocity of the actuator for determining a key or button response associated with the actuator motion sensor;
wherein the signal processor is configurable to adjust the key or button response of one or more of the actuator motion sensors, individually or in groups, to configure the sensitivity of the actuator motion sensors to motion such that different ones of the actuator motion sensors are configurable to have different sensitivities to motion.

12. The sensing system of claim 11 further comprising non-volatile memory associated with the signal processor to store sensitivity configuration data defining the sensitivity of the actuator motion sensors, individually or in groups, and an interface to enable one or more of: user definition of the sensitivity configuration data, import of the sensitivity configuration data, and export of the sensitivity configuration data.

13. The sensing system of claim 1, wherein at least the active resonant circuit comprises a coil with windings in opposite senses, in particular wherein the windings in opposite senses are configured to generate magnetic fields in opposite senses to cancel one another.

14. The sensing system of claim 13 wherein each of the passive resonant circuit and the active resonant circuit comprises a coil with first and second windings in opposite senses, and wherein the first and second windings are on opposite sides of the axis.

15. The sensing system of claim 1, including a backplane, wherein the backplane bears a plurality of the active resonant circuits each comprising a respective coil with one or more windings, wherein at least some of the active resonant circuits are paired such that in a pair of the active resonant circuits a configuration of the one or more windings of a coil of one of the active resonant circuits is of opposite sense to a configuration of the one or more windings of a coil of the other of the active resonant circuit.

16. The sensing system of claim 15, further comprising the at least one sensor driver, wherein the active resonant circuits are arranged in spatial groups and wherein, for all the active resonant circuits in a spatial group, the one or more windings of the coils of the active resonant circuits have the same sense, wherein in adjacent spatial groups the one or more windings of the coils of the active resonant circuits have opposite senses, and wherein within a spatial group the active resonant circuits are multiplexed such that they are driven sequentially in time.

17. The sensing system of claim 1, further comprising a temperature-compensation system to temperature-compensate the detected level of RF signal, wherein the temperature-compensation system is configured to apply an off-resonance drive signal to at least one of the active resonant circuits, to measure a level of the off-resonance drive signal from the at least one detector, and to compensate the detected level of RF signal responsive to the level of the off-resonance drive signal.

18. The sensing system of claim 17 wherein the multiplexing system is configured to multiplex the drive signal such that one of the actuator motion sensors is driven in each of a set of time slots, and wherein the temperature-compensation system is configured to apply the off-resonance drive signal during an additional time slot to the set of time slots.

19. A computer mouse, game controller, computer or alphanumeric keyboard, or joystick comprising a sensing system comprising:
an actuator, wherein the actuator is configured to attach to or comprises or consists of a key top or button;
an actuator motion sensor associated with the actuator to detect motion of the actuator, the actuator motion sensor comprising:
a passive resonant circuit configured to be moved by the actuator and having a resonant frequency;
an active resonant circuit configured to excite the passive resonant circuit at the resonant frequency;
a biasing element configured to exert a biasing force on the actuator, wherein either:
the actuator is movable along an axis and the biasing element is configured to exert the biasing force along the axis; or
wherein the actuator is a hinged actuator and the biasing element is configured to exert the biasing force on the actuator directed to bias the passive resonant circuit of the actuator away from the active resonant circuit;
at least one sensor driver to drive the active resonant circuit with an RF drive signal at the resonant frequency;
at least one detector to detect a level of RF signal from a driven actuator motion sensor for sensing at least one of a position and a velocity of the actuator associated with the actuator motion sensor.

20. A sensing system according to claim 1, additionally comprising a backplane, wherein the backplane bears a plurality of the active resonant circuits each comprising a respective coil with one or more windings, wherein at least some of the active resonant circuits are paired such that in a pair of the active resonant circuits a configuration of the one or more windings of a coil of one of the active resonant circuits is of opposite sense to a configuration of the one or more windings of a coil of the other of the active resonant circuit.

21. A backplane as defined in claim 20 further comprising the at least one sensor driver, wherein the active resonant circuits are arranged in spatial groups and wherein, for all the active resonant circuits in a spatial group, the one or more windings of the coils of the active resonant circuits have the same sense, wherein adjacent spatial groups the one or more windings of the coils of the active resonant circuits have opposite senses, and wherein within a spatial group the active resonant circuits are multiplexed such that are driven sequentially in time.

* * * * *

UNITED STATES PATENT AND TRADEMARK OFFICE
CERTIFICATE OF CORRECTION

PATENT NO. : 11,422,637 B2
APPLICATION NO. : 17/266446
DATED : August 23, 2022
INVENTOR(S) : James Hastings Clark, John Michael McAuliffe and Archibald J. Clark It is certified that error appears in the above-identified patent and that said Letters Patent is hereby corrected as shown below:

On the Title Page

Item (30) "Foreign Application Priority Data" should read as follows:
Aug. 7, 2018 (GB)............................1812826.4
Jun. 26, 2019 (GB)............................1909214.7

Signed and Sealed this
Twentieth Day of December, 2022

Katherine Kelly Vidal
*Director of the United States Patent and Trademark Office*